US011019725B2

(12) United States Patent
Yamaguchi

(10) Patent No.: US 11,019,725 B2
(45) Date of Patent: May 25, 2021

(54) WIRING SUBSTRATE

(71) Applicant: SHINKO ELECTRIC INDUSTRIES CO., LTD., Nagano-ken (JP)

(72) Inventor: Yasuyuki Yamaguchi, Nagano (JP)

(73) Assignee: SHINKO ELECTRIC INDUSTRIES CO., LTD.

( * ) Notice: Subject to any disclaimer, the term of this patent is extended or adjusted under 35 U.S.C. 154(b) by 0 days.

(21) Appl. No.: 16/937,999

(22) Filed: Jul. 24, 2020

(65) Prior Publication Data
US 2021/0037652 A1  Feb. 4, 2021

(30) Foreign Application Priority Data

Jul. 29, 2019 (JP) .............................. JP2019-139013

(51) Int. Cl.
| H05K 1/18 | (2006.01) |
| H05K 1/02 | (2006.01) |
| H05K 3/46 | (2006.01) |
| H05K 3/30 | (2006.01) |
| H05K 1/11 | (2006.01) |

(52) U.S. Cl.
CPC ............ *H05K 1/186* (2013.01); *H05K 1/0298* (2013.01); *H05K 1/115* (2013.01); *H05K 3/30* (2013.01); *H05K 3/4644* (2013.01); *H05K 2201/09063* (2013.01)

(58) Field of Classification Search
CPC .......... H05K 1/186; H05K 3/30; H05K 1/115; H05K 1/0298; H05K 3/4644; H05K 2201/09063; H05K 1/182–185
See application file for complete search history.

(56) References Cited

U.S. PATENT DOCUMENTS

| 7,682,879 | B2 * | 3/2010 | Echols | ................... | H01L 24/31 |
| | | | | | 438/127 |
| 2006/0191711 | A1 * | 8/2006 | Cho | ....................... | H01L 24/24 |
| | | | | | 174/260 |
| 2007/0132536 | A1 * | 6/2007 | Lee | ......................... | H01L 24/32 |
| | | | | | 336/200 |
| 2007/0238220 | A1 * | 10/2007 | Lii | ....................... | H01L 23/295 |
| | | | | | 438/106 |

(Continued)

FOREIGN PATENT DOCUMENTS

JP            2016207958 A       12/2016

*Primary Examiner* — Steven T Sawyer
(74) *Attorney, Agent, or Firm* — Tarolli, Sundheim, Covell & Tummino LLP

(57) ABSTRACT

A wiring substrate includes a first insulation layer, a second insulation layer formed on an upper surface of the first insulation layer, an opening extending through the second insulation layer, an adhesive layer formed on a bottom surface in the opening, an electronic component fixed in the opening by the adhesive layer, a filling insulation layer covering an upper surface of the second insulation layer and filling the opening to cover the electronic component, and a wiring layer formed on an upper surface of the filling insulation layer. The adhesive layer includes a base portion covering a lower surface of the electronic component in tight contact and a cover portion covering a side surface of the electronic component in tight contact. The cover portion has a lower filler content ratio than the base portion. The filling insulation layer covers a side surface of the cover portion in tight contact.

20 Claims, 12 Drawing Sheets

(56) References Cited

U.S. PATENT DOCUMENTS

| | | | | |
|---|---|---|---|---|
| 2007/0262470 | A1* | 11/2007 | Ichiryu | H01L 23/49833 |
| | | | | 257/783 |
| 2009/0057928 | A1* | 3/2009 | Zhai | H01L 23/3164 |
| | | | | 257/789 |
| 2009/0174081 | A1* | 7/2009 | Furuta | H01L 23/5385 |
| | | | | 257/777 |
| 2012/0227261 | A1* | 9/2012 | Inui | H05K 1/0206 |
| | | | | 29/849 |
| 2012/0228012 | A1* | 9/2012 | Yoshikawa | H05K 1/188 |
| | | | | 174/257 |
| 2016/0037647 | A1* | 2/2016 | Shimizu | H05K 1/186 |
| | | | | 361/764 |
| 2016/0322295 | A1* | 11/2016 | Kobayashi | H01L 23/49816 |
| 2017/0094797 | A1* | 3/2017 | Baek | H05K 1/185 |

* cited by examiner

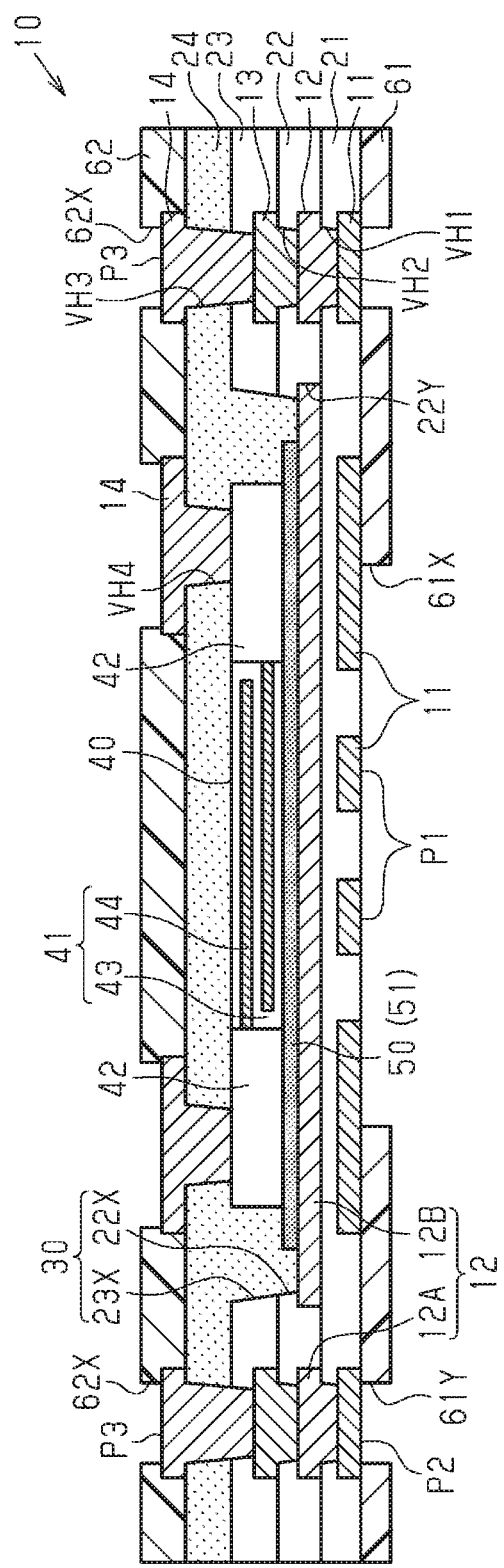

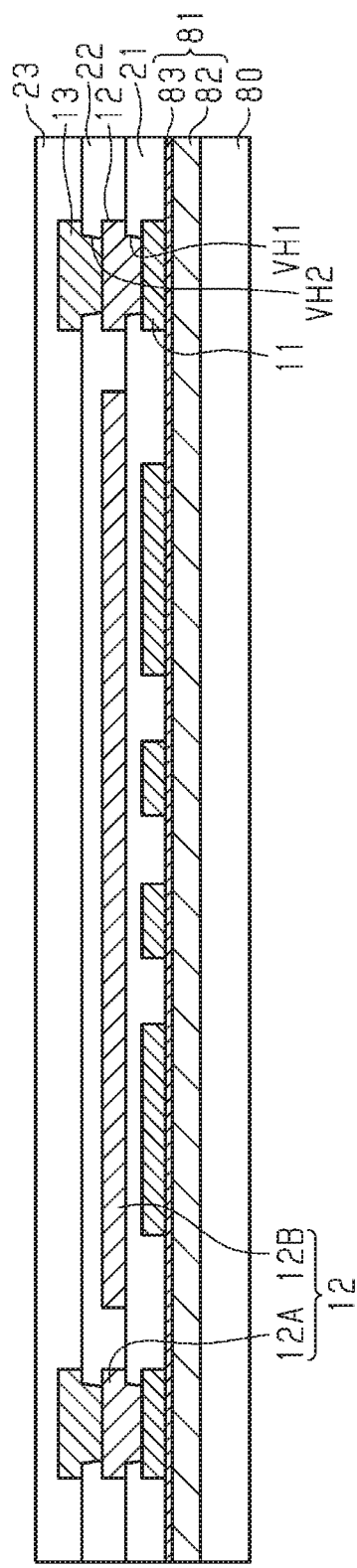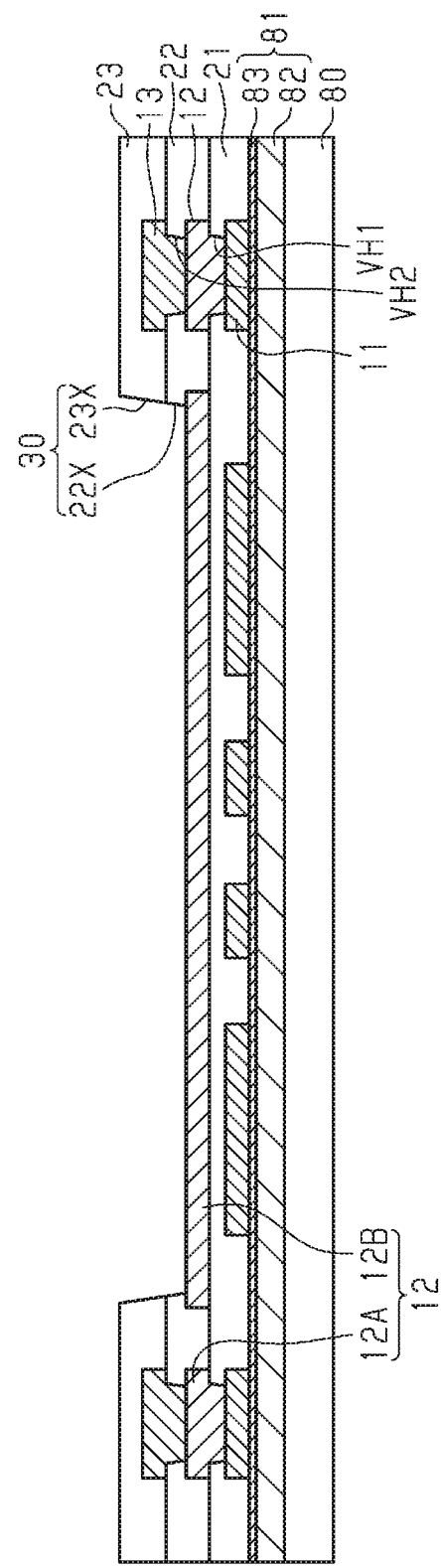

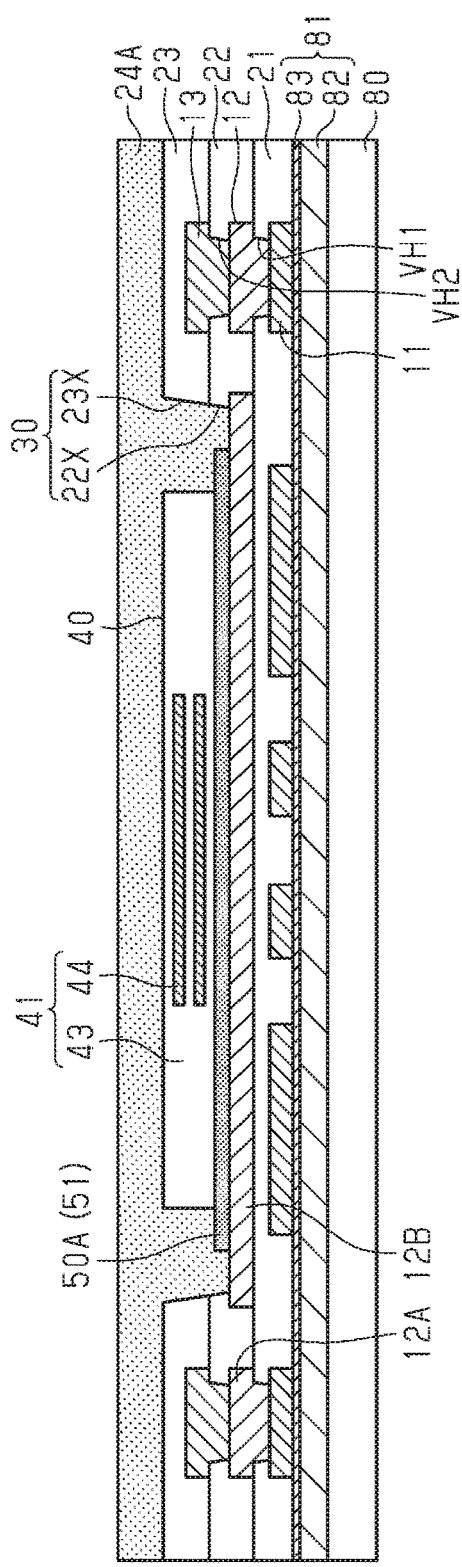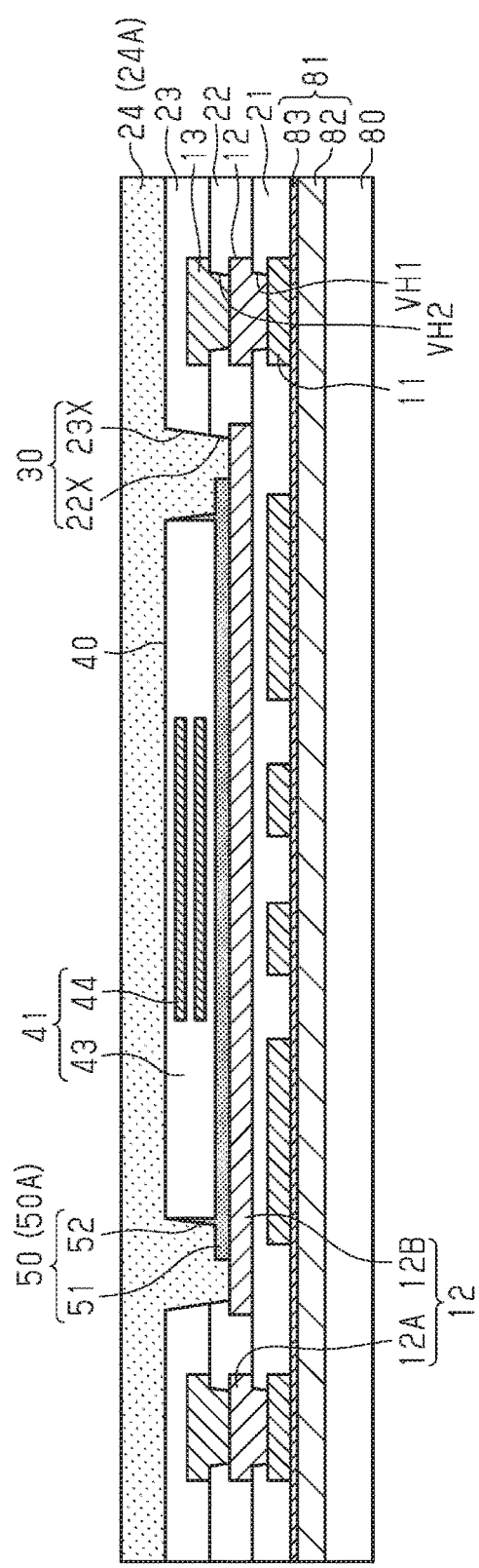

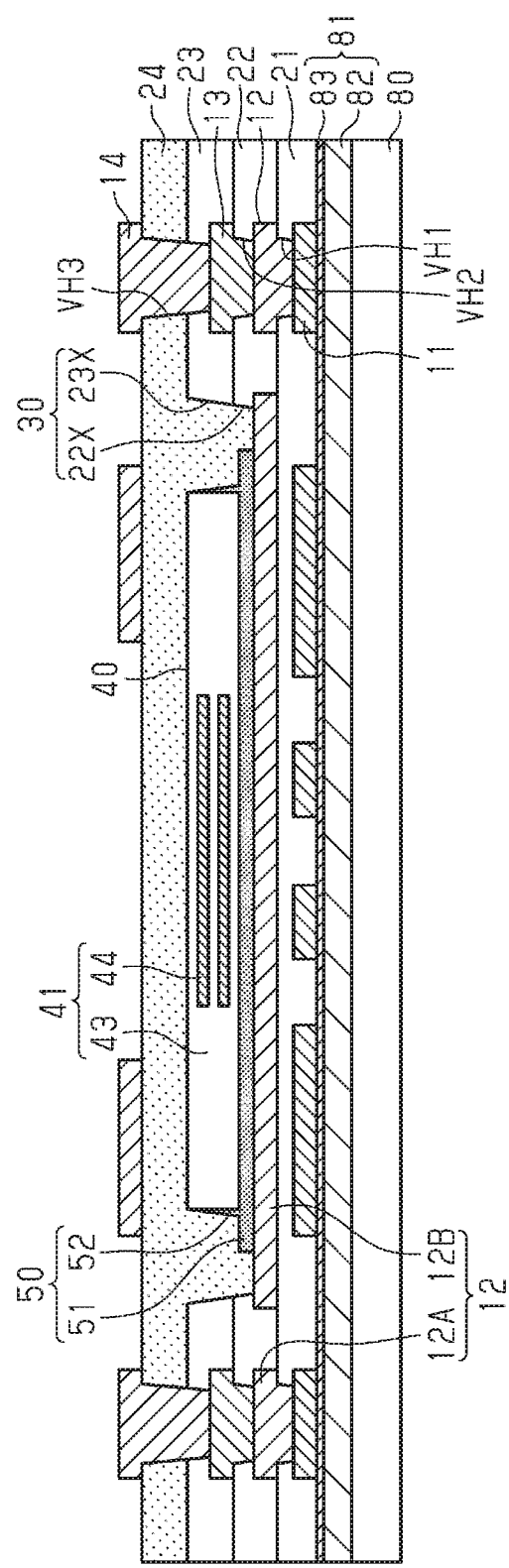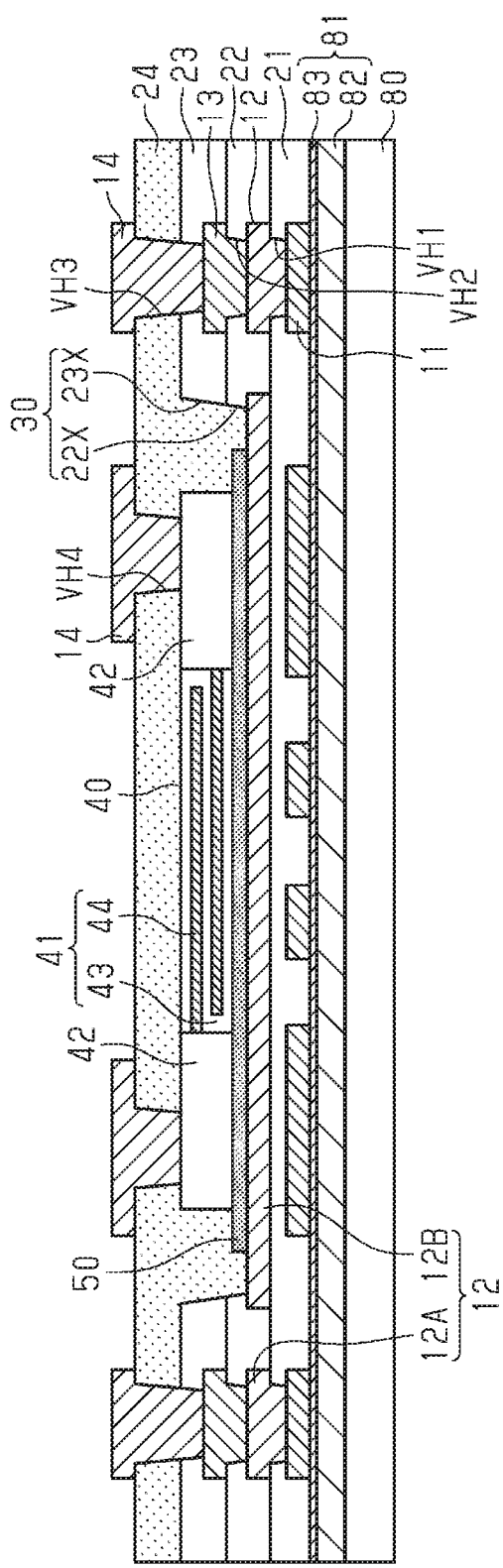

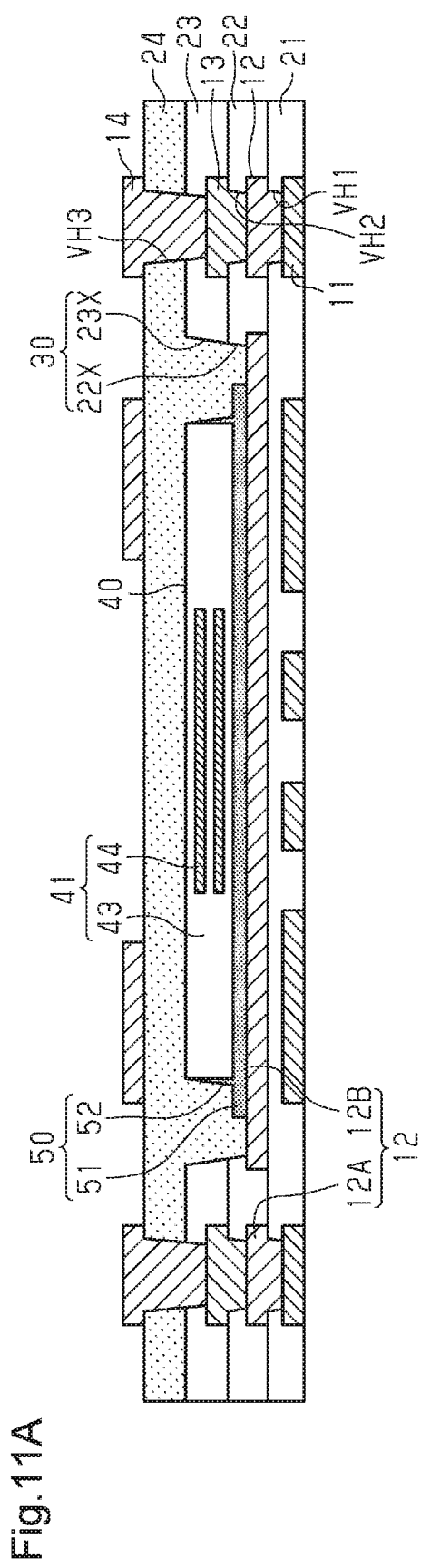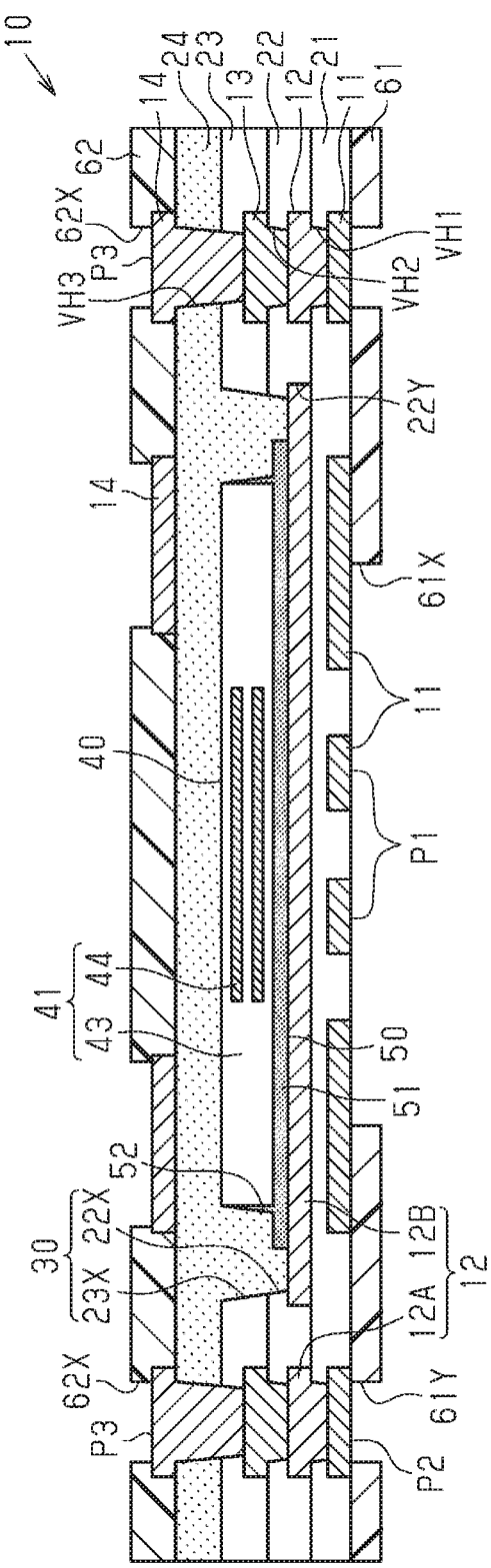

WIRING SUBSTRATE

CROSS-REFERENCE TO RELATED APPLICATIONS

This application is based upon and claims the benefit of priority from prior Japanese Patent Application No. 2019-139013, filed on Jul. 29, 2019, the entire contents of which are incorporated herein by reference.

FIELD

The disclosure relates to a wiring substrate and a method for manufacturing a wiring substrate.

BACKGROUND

Japanese Laid-Open Patent Publication No. 2016-207958 discloses a wiring substrate that incorporates an electronic component such as a chip capacitor. This type of wiring substrate includes an insulation layer with a cavity. The electronic component is fixed to the bottom surface of the cavity via an adhesive layer, and the cavity is filled with a filling insulation layer so that the side and upper surfaces of the electronic component is covered by the filling insulation layer.

In a known wiring substrate, adhesion between an electronic component and a filling insulation layer is low so that the electronic component may rotate in the cavity or move in a planar direction. This lowers the reliability of an electrical connection between an electrode terminal of the electronic component and a via connected to the electrode terminal.

SUMMARY

An aspect of a wiring substrate includes a first insulation layer, a second insulation layer formed on an upper surface of the first insulation layer, an opening extending through the second insulation layer in a thickness-wise direction, an adhesive layer formed on a bottom surface in the opening, an electronic component fixed in the opening by the adhesive layer, a filling insulation layer that covers an upper surface of the second insulation layer and fills the opening to cover the electronic component, and a wiring layer formed on an upper surface of the filling insulation layer. The adhesive layer includes a base portion that covers a lower surface of the electronic component in a tight contact state and a cover portion that covers a side surface of the electronic component in a tight contact state. A content ratio of filler in the cover portion is lower than a content ratio of filler in the base portion. The filling insulation layer covers a side surface of the cover portion in a tight contact state.

BRIEF DESCRIPTION OF THE DRAWINGS

The embodiments, together with objects and advantages thereof, may best be understood by reference to the following description of the presently preferred embodiments together with the accompanying drawings in which:

FIG. 2 is a schematic cross-sectional view of the wiring substrate illustrated in FIG. 1A (cross-sectional view taken along line 2-2 in FIG. 3);

FIGS. 5A, 5B, 5C, 6A, 6B, 7A, 7B, 8A, 8B, 9A, 9B, 10A, 10B, 11A, and 11B are schematic cross-sectional views illustrating a method for manufacturing the wiring substrate illustrated in FIG. 1A.

DESCRIPTION OF THE EMBODIMENTS

Figure 1A:
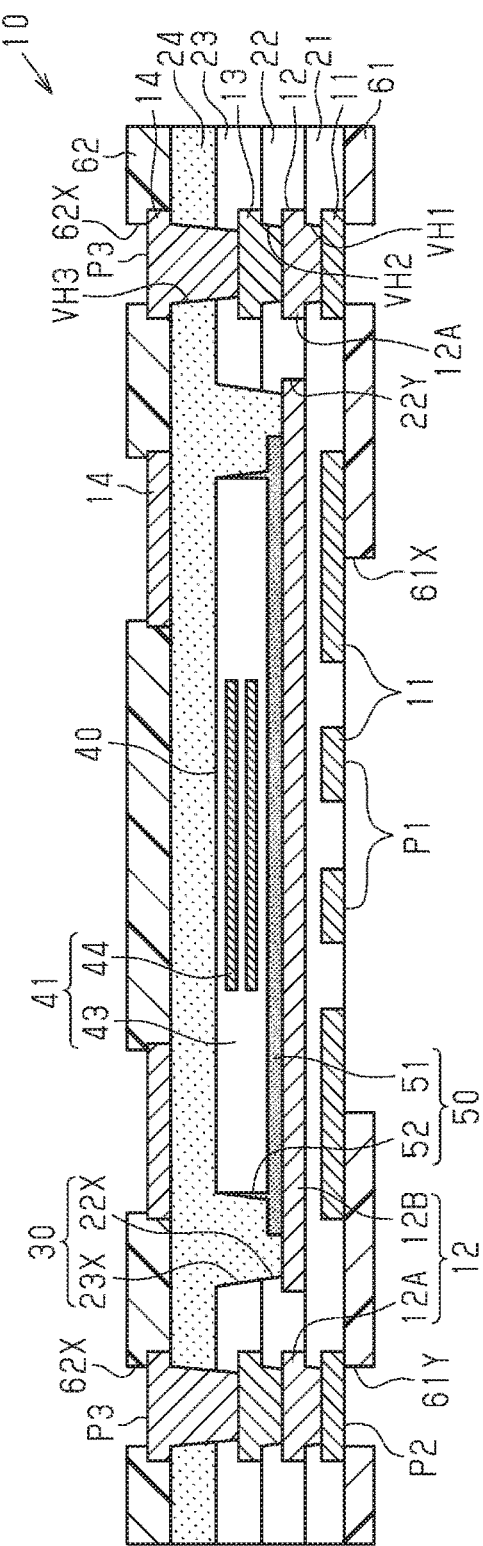
FIG. 1A is a schematic cross-sectional view illustrating an embodiment of a wiring substrate (cross-sectional view taken along line 1-1 in FIG. 3)

An embodiment will be described below with reference to the drawings. Elements in the drawings may be partially enlarged for simplicity and clarity and thus have not necessarily been drawn to scale. To facilitate understanding, hatching lines may not be illustrated or be replaced by shadings in the cross-sectional drawings. In this specification, "plan view" refers to a view of a subject taken in a vertical direction (for example, upper-lower direction in FIG. 1A), and "planar shape" refers to a shape of a subject taken in the vertical direction. The terms "orthogonal" and "horizontal" in this specification are not limited to exactly orthogonal and horizontal, and includes generally orthogonal and horizontal within the scope in which the operation and advantages of the embodiment are obtained.

The structure of a wiring substrate 10 will now be described.

As illustrated in FIG. 1A, the wiring substrate 10 has a structure in which a wiring layer 11, an insulation layer 21, a conductive layer 12, an insulation layer 22, a wiring layer 13, an insulation layer 23, an insulation layer 24, and a wiring layer 14 are sequentially stacked. In the present example, the wiring substrate 10 has a configuration of a so-called coreless substrate that does not include a core substrate as a support substrate. The wiring substrate 10 differs from a wiring substrate that includes a core substrate and is manufactured through a typical build-up process, that is, a wiring substrate in which a desired number of build-up layers is sequentially stacked on one or both of the opposite surfaces of the core substrate.

The wiring substrate 10 includes one or more (in the present example, one) chip capacitors 40 disposed in an opening 30 formed in the insulation layers 22 and 23, a solder resist layer 61 formed on the lower surface of the insulation layer 21, and a solder resist layer 62 formed on the upper surface of the insulation layer 24. Thus, the wiring substrate 10 incorporates the chip capacitor 40.

The material of the wiring layers 11, 13, and 14 and the conductive layer 12 may be, for example, copper (Cu) or a copper alloy. The material of the insulation layers 21 to 24 may be, for example, an insulative resin, such as epoxy resin and polyimide resin, or a resin material obtained by mixing the resin with a filler such as silica and alumina. The material of the insulation layers 21 to 24 may be, for example, an insulative resin containing a reinforcement material, which is obtained by impregnating a reinforcement material such as a woven or non-woven cloth of glass fiber, aramid fiber, or liquid crystal polymer (LCP) fiber, with a thermosetting resin including epoxy resin or polyimide resin as a main component. The material of the insulation layers 21 to 24 may be a non-photosensitive insulative resin including a thermosetting resin as a main component or an insulative resin including a photosensitive resin as a main component.

The wiring layer 11 is the outermost wiring layer (in FIG. 1A, the lowermost wiring layer) of the wiring substrate 10. The lower surface of the wiring layer 11 is exposed from the insulation layer 21. In the present example, the lower surface of the wiring layer 11 is substantially flush with the lower surface of the insulation layer 21. The lower surface of the wiring layer 11 may be recessed from the lower surface of the insulation layer 21 toward the conductive layer 12.

The wiring layer 11 is, for example, a fine wiring layer that is finer than the conductive layer 12 and the wiring layers 13 and 14. The line-and-space (L/S) of the wiring layer 11 may be, for example, approximately 1 µm/1 µm to 5 µm/5 µm. The line-and-space (L/S) indicates a wiring width (L) and a wiring interval (S) between adjacent wirings. The thickness of the wiring layer 11 may be, for example, approximately 3 µm to 20 µm.

The insulation layer 21 covers the upper surface and the side surfaces of the wiring layer 11 and exposes the lower surface of the wiring layer 11. Through holes VH1 extend through the insulation layer 21 in the thickness-wise direction to expose part of the upper surface of the wiring layer 11 in desired locations. Each through hole VH1 is, for example, tapered so that the opening width (diameter) is decreased from the upper side (the upper surface of the insulation layer 21) toward the lower side (the upper surface of the wiring layer 11) in FIG. 1A. The through hole VH1 has a shape of, for example, an inverted truncated cone so that the lower open end has a smaller diameter than the upper open end. The thickness of the insulation layer 21 from the upper surface of the wiring layer 11 to the upper surface of the insulation layer 21 may be, for example, approximately 10 µm to 35 µm.

The conductive layer 12 is formed on the upper surface of the insulation layer 21. The thickness of the conductive layer 12 may be, for example, approximately 10 µm to 30 µm.

The conductive layer 12 includes, for example, a wiring layer 12A and a metal layer 12B. The wiring layer 12A and the metal layer 12B are, for example, spaced apart from each other and electrically insulated from each other. The wiring layer 12A is coplanar with the metal layer 12B.

The wiring layer 12A is, for example, electrically connected to the wiring layer 11 by via wirings filling the through holes VH1. The wiring layer 12A is, for example, formed integrally with the via wirings filling the through holes VH1.

The metal layer 12B is, for example, formed in a mount region of the chip capacitor 40. The metal layer 12B, for example, overlaps with the chip capacitor 40 in plan view. The metal layer 12B, for example, overlaps with the opening 30 in plan view. The metal layer 12B is, for example, greater in planar size than the opening 30. For example, the outer edge of the metal layer 12B is located outside the edge defining the opening 30 in plan view. The metal layer 12B is, for example, rectangular in plan view. In the present example, the metal layer 12B is not electrically connected to other wiring layers and other conductive layers and is electrically isolated (floating). Instead, the metal layer 12B may be, for example, a power wiring, a ground wiring, or a wiring pattern that is laid out to form wiring. When the metal layer 12B is a power wiring pattern, a ground wiring, or a wiring pattern, the metal layer 12B is, for example, electrically connected to other wiring layers or conductive layers by via wirings.

The insulation layer 22 is formed on the upper surface of the insulation layer 21 to cover the conductive layer 12. The upper surface of the insulation layer 22 is located at a lower position than the upper surface of the chip capacitor 40 incorporated in the wiring substrate 10. The thickness of the insulation layer 22 from the upper surface of the conductive layer 12 to the upper surface of the insulation layer 22 is, for example, approximately 30 µm to 60 µm.

Through holes VH2 extend through the insulation layer 22 in the thickness-wise direction to expose part of the upper surface of the conductive layer 12 (in the present example, the wiring layer 12A) in desired locations. Each through hole VH2 is, for example, tapered so that the opening width is decreased from the upper side to the lower side in FIG. 1A. The through hole VH2 has a shape of, for example, an inverted truncated cone so that the lower open end has a smaller diameter than the upper open end.

The wiring layer 13 is formed on the upper surface of the insulation layer 22. The wiring layer 13 is electrically connected to the wiring layer 12A by via wirings filling the through holes VH2. The wiring layer 13 is, for example, formed integrally with the via wirings filling the through holes VH2. The thickness of the wiring layer 13 may be, for example, approximately 10 µm to 20 µm.

The insulation layer 23 is formed on the upper surface of the insulation layer 22 to cover the wiring layer 13. The thickness of the insulation layer 23 from the upper surface of the wiring layer 13 to the upper surface of the insulation layer 23 may be, for example, approximately 15 µm to 45 µm.

The opening 30 extends through, for example, the insulation layer 22 and the insulation layer 23 in the thickness-wise direction. The opening 30, for example, exposes part of the upper surface of the metal layer 12B. The opening 30 is formed corresponding to the chip capacitor 40 incorporated in the wiring substrate 10. That is, the opening 30 is formed at the mount position of the chip capacitor 40.

Figure 3:
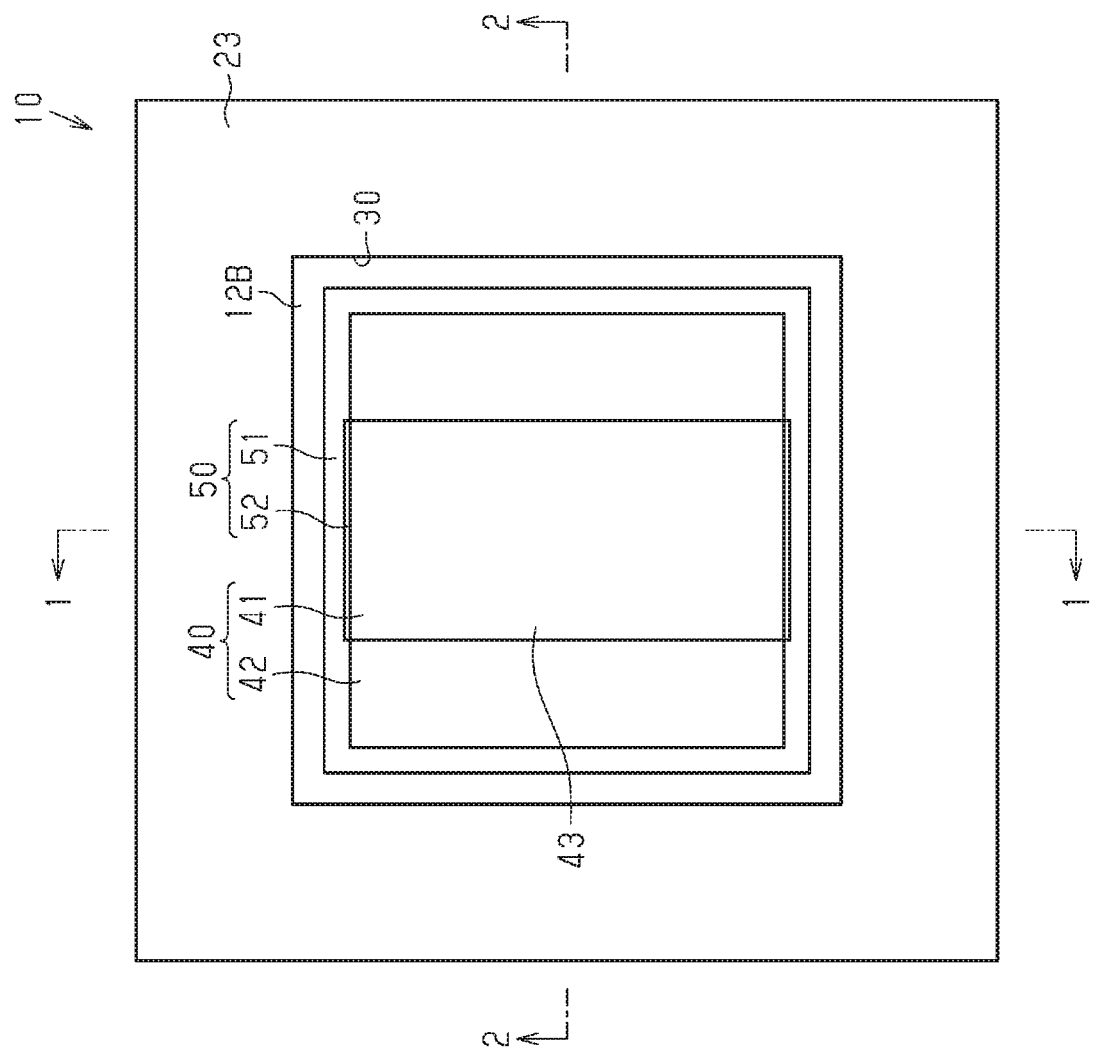
FIG. 3 is a schematic plan view of the wiring substrate illustrated in FIG. 1A.

As illustrated in FIG. 3, in the present example, the opening 30 is rectangular in plan view. The opening 30 is greater in planar size than the chip capacitor 40. The opening 30 is, for example, smaller in planar size than the metal layer 12B. The size of the opening 30 may be, for example, approximately 0.7 mm×0.4 mm to 15 mm×15 mm in plan view. FIG. 3 is a plan view of the wiring substrate 10 illustrated in FIG. 1A taken from above. The insulation layer 24, the wiring layer 14, and the solder resist layer 62 are transparently illustrated.

As illustrated in FIG. 1A, in the present example, the opening 30 includes a through hole 22X that extends through the insulation layer 22 in the thickness-wise direction and a through hole 23X that extends through the insulation layer 23 in the thickness-wise direction and is in communication with the through hole 22X. The wall surface of the through hole 22X is, for example, continuous with the wall surface of the through hole 23X. The through holes 22X and 23X are, for example, coaxial with each other. That is, the axis of the through hole 22X coincides with the axis of the through hole 23X in plan view.

The through holes 22X and 23X are, for example, tapered so that the opening width is decreased from the upper side (the upper surface of the insulation layer 23) toward the lower side (the upper surface of the metal layer 12B) in FIG. 1A. That is, the through holes 22X and 23X are tapered from the upper opening toward the lower opening. The space surrounded by the wall surfaces of the through holes 22X and 23X and the upper surface of the metal layer 12B exposed in the bottom of the through holes 22X and 23X is a cavity that accommodates the chip capacitor 40. In the wiring substrate 10 of the present example, the two insulation layers 22 and 23, which are formed on the insulation layer 21, or the lowermost insulation layer, are used as an insulation layer for forming the cavity.

In the present example, the insulation layer 22 includes a recess 22Y that is recessed from the side surface of the insulation layer 22, which forms the wall surface of the through hole 22X. For example, a lower portion of the side surface of the insulation layer 22, which is in contact with the insulation layer 21, is recessed relative to an upper portion of the side surface of the insulation layer 22 to form the recess 22Y. The recess 22Y is in communication with the through hole 22X. In other words, the through hole 22X includes the recess 22Y, which increases the width of the bottom of the through hole 22X. The recess 22Y is formed, for example, in the bottom of the through hole 22X along the entire perimeter. The width of the recess 22Y may be, for example, approximately 20 μm to 80 μm. The recess 22Y is, for example, filled with the metal layer 12B. For example, the outer peripheral portion of the metal layer 12B is located in the recess 22Y. In other words, the metal layer 12B is slightly greater in planar size than the lower portion of the opening 30.

The chip capacitor 40 is adhered to the upper surface of the metal layer 12B exposed in the opening 30 by an adhesive layer 50. Thus, the chip capacitor 40 is disposed in the opening 30 (cavity).

As illustrated in FIG. 2, the chip capacitor 40 includes, for example, a rectangular-box-shaped capacitor body 41 and two electrode terminals 42 located on horizontally opposite ends of the capacitor body 41. The chip capacitor 40 may be, for example, a ceramic chip capacitor. The capacitor body 41 has, for example, a multilayer stacking structure of dielectric layers 43 and inner electrodes 44. The material of the dielectric layers 43 may be, for example, ceramic. The material of the inner electrodes 44 may be, for example, nickel (Ni), a Ni alloy, Cu, or a Cu alloy. The material of the electrode terminals 42 may be, for example, Cu or a Cu alloy. The thickness of the chip capacitor 40 may be, for example, approximately 80 μm to 120 μm.

The chip capacitor 40 is disposed in the opening 30 so that, for example, the upper surface of the chip capacitor 40 is coplanar with the upper surface of the insulation layer 23 or located at a lower position than the upper surface of the insulation layer 23. However, if the difference in height between the upper surface of the insulation layer 23 and the upper surface of the chip capacitor 40 is slight (for example, less than or equal to one-third of the thickness from the upper surface of the insulation layer 23 to the upper surface of the insulation layer 24), the upper surface of the insulation layer 23 may be located at a lower position than the upper surface of the chip capacitor 40.

Figure 1B:
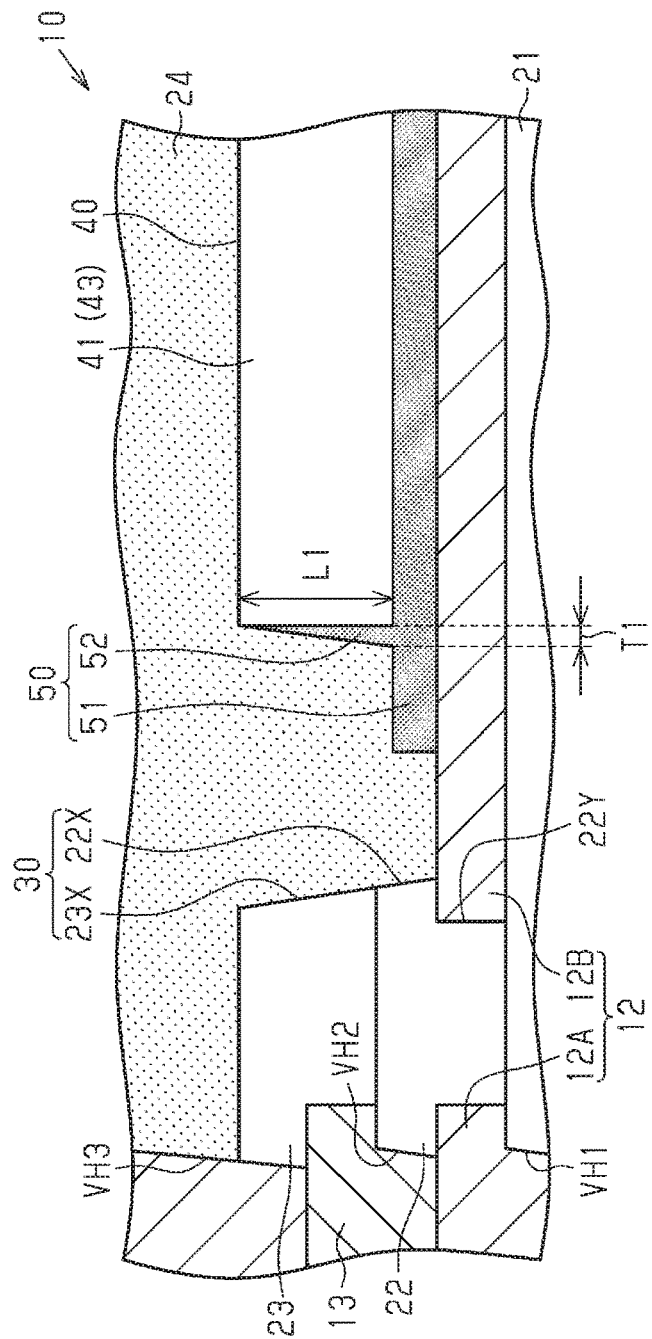
FIG. 1B is a partial enlarged cross-sectional view of the wiring substrate illustrated in FIG. 1A.

As illustrated in FIG. 1B, the adhesive layer 50 includes a base portion 51 that covers the lower surface of the chip capacitor 40 in a tight contact state and a cover portion 52 that covers the side surface of the chip capacitor 40 in a tight contact state. The base portion 51 is formed continuously and integrally with the cover portion 52.

The base portion 51 is, for example, formed on the upper surface of the metal layer 12B exposed in the bottom of the opening 30. The base portion 51, for example, extends on the upper surface of the metal layer 12B in a planar direction that is orthogonal to the stacking direction (in FIG. 1B, vertical direction) of the wiring substrate 10.

As illustrated in FIG. 3, in the present example, the base portion 51 is rectangular in plan view. The base portion 51 is greater in planar size than the chip capacitor 40. The base portion 51 is, for example, smaller in planar size than the metal layer 12B exposed in the opening 30. The base portion 51, for example, exposes part of the upper surface of the metal layer 12B exposed in the opening 30.

As illustrated in FIG. 2, the base portion 51 covers, for example, the entire lower surface of the chip capacitor 40. The base portion 51 covers, for example, the entire lower surface of the chip capacitor 40 in a tight contact state. The thickness of the base portion 51 may be, for example, approximately 5 μm to 10 μm.

As illustrated in FIG. 1B, the cover portion 52, for example, extends upward, or rises, from the upper surface of the base portion 51 and covers the side surface of the chip capacitor 40. Thus, the cover portion may also be referred to as a rising portion. In the side surface of the chip capacitor 40, the cover portion 52 covers, for example, the side surface of the capacitor body 41. The cover portion 52 at least partially rises from the base portion 51 at a height of more than half of the side surface of the capacitor body 41. The cover portion 52 covers, for example, the entire side surface of the capacitor body 41 in a tight contact state. The cover portion 52 covers, for example, the entire side surface of the dielectric layers 43 formed of ceramic in a tight contact state.

As illustrated in FIG. 3, of the side surface of the chip capacitor 40, the cover portion 52 covers, for example, only the side surface of the capacitor body 41 (the dielectric layers 43). In other words, of the side surface of the chip capacitor 40, the cover portion 52 is not formed on the side surfaces of the electrode terminals 42 and exposes the side surfaces of the electrode terminals 42.

As illustrated in FIG. 1B, the cover portion 52 has a thickness that is, for example, decreased from the upper surface of the base portion 51 toward the upper surface of the chip capacitor 40. The thickness of the cover portion 52 refers to a distance (interval) between the side surface of the capacitor body 41 and the side surface of the cover portion 52. In other words, the cover portion 52 extends outward from the upper surface of the chip capacitor 40 toward the base portion 51. Thus, the side surface of the cover portion 52 is an inclined surface extending closer to the side surface of the capacitor body 41 from the base portion 51 toward the upper surface of the chip capacitor 40. The cross-sectional shape of the cover portion 52 is, for example, a right triangle. The thickness of the lower part of the cover portion 52 may be, for example, approximately 1 μm to 2 μm. The thickness of the upper part of the cover portion 52 may be, for example, approximately 0.1 μm to 0.2 μm.

The cover portion 52 is formed so that, for example, the thickness is decreased as the length (for example, corresponding to height) along the side surface of the chip capacitor 40 is increased. The cover portion 52 is formed so that, for example, when the cover portion 52 extends upward from the upper surface of the base portion 51 over length L1 along the side surface of the chip capacitor 40, and the maximum thickness of the cover portion 52 is denoted by T1, the ratio L1/T1 is greater than or equal to five, and preferably, greater than or equal to ten. In the present example, since the side surface of the capacitor body 41 extends vertically from the upper surface of the base portion 51, the length L1 is the height of the cover portion 52 from the upper surface of the base portion 51 to the upper end of the cover portion 52. In the present example, since the thickness of the cover portion 52 is maximal in the lower part of the cover portion 52 proximate to the base portion 51, the thickness T1 is the thickness of the lower part of the cover portion 52.

The cover portion 52 is not formed, for example, on the upper surface of the chip capacitor 40. That is, the cover portion 52 exposes the upper surface of the chip capacitor 40. However, the cover portion 52 may cover part of the upper surface of the chip capacitor 40.

The adhesive layer 50 may be, for example, an epoxy-based, polyimide-based, or silicone-based thermosetting adhesive. The adhesive layer 50 may include, for example, a filler such as silica or alumina. In the present example, an adhesive obtained by mixing a filler into a base resin such as epoxy resin is used as the adhesive layer 50.

For example, the adhesion of the adhesive layer 50 to the chip capacitor 40 is higher than that of the insulation layer 24. For example, the adhesion of the adhesive layer 50 to the dielectric layer 43 of the capacitor body 41 is higher than that of the insulation layer 24. The adhesive layer 50 has, for example, a lower rigidity than the insulation layer 24.

The minimum melt viscosity of the adhesive layer 50 is, for example, set to be lower than the minimum melt viscosity of the insulation layer 24. The "minimum melt viscosity" of a resin composition layer such as the adhesive layer 50 or the insulation layer 24 refers to the minimum viscosity of the resin composition layer when resin in the resin composition layer melts. When the resin composition layer is heated at a constant temperature increasing rate to melt the resin, the melt viscosity decreases as the temperature increases at an early stage. Then, when the temperature exceeds a particular temperature, the melt viscosity increases as the temperature increases. The melt viscosity at the local minimum point is the minimum melt viscosity. The minimum melt viscosity of a resin composition layer may be measured by, for example, a dynamic viscoelastic method.

The content ratio of filler in the cover portion 52 is, for example, lower than the content ratio of filler in the base portion 51. The content ratio of filler in the cover portion 52, for example, is decreased from a position close to the base portion 51 toward the upper surface of the chip capacitor 40 (i.e., away from the base portion 51). The content ratio of filler in the upper part of the cover portion 52 is, for example, zero. In this case, the minimum melt viscosity of the cover portion 52 is, for example, lower than the minimum melt viscosity of the base portion 51. The minimum melt viscosity of the base portion 51 is lower than the minimum melt viscosity of the insulation layer 24.

The temperature at which the adhesive layer 50 reaches the minimum melt viscosity is, for example, set to be lower than that of the insulation layer 24. That is, the adhesive layer 50 reaches the minimum melt viscosity at a lower temperature than the insulation layer 24.

The chip capacitor 40 is fixed in the opening 30 by the adhesive layer 50 that has been described above. Here, the adhesive layer 50 is in tight contact with the lower surface and the side surface of the chip capacitor 40. Thus, the adhesion strength between the adhesive layer 50 and the chip capacitor 40 is increased as compared to when the adhesive layer 50 is in tight contact with only the lower surface of the chip capacitor 40.

As illustrated in FIG. 1A, the insulation layer 24 covers the upper surface of the insulation layer 23 and fills the opening 30 to cover the chip capacitor 40. The insulation layer 24, for example, covers the entire side surface of the base portion 51 of the adhesive layer 50, the entire upper surface of the base portion 51 exposed from the chip capacitor 40, and the entire side surface of the cover portion 52 of the adhesive layer 50. The insulation layer 24, for example, covers the entire side surface and the entire upper surface of the base portion 51 and the entire side surface of the cover portion 52 in a tight contact state. The insulation layer 24, for example, entirely covers the chip capacitor 40 exposed from the adhesive layer 50. The insulation layer 24, for example, covers the side surface and the upper surface of the chip capacitor 40 exposed from the adhesive layer 50. As illustrated in FIG. 2, the insulation layer 24, for example, covers the entire side surface and the entire upper surface of the electrode terminals 42 and the entire upper surface of the capacitor body 41. The insulation layer 24, for example, covers the entire upper surface of the metal layer 12B exposed from the adhesive layer 50, the entire wall surface of the through hole 22X, and the entire wall surface of the through hole 23X.

The insulation layer 24, for example, covers the entire upper surface of the insulation layer 23. Through holes VH3 extend through the insulation layers 23 and 24 in the thickness-wise direction to expose part of the upper surface of the wiring layer 13 in desired locations. Through holes VH4 extend through the insulation layer 24 in the thickness-wise direction to expose part of the upper surfaces of the electrode terminals 42 in desired locations. Each through hole VH3 is, for example, tapered so that the opening width (diameter) is decreased from the upper side (the upper surface of the insulation layer 24) toward the lower side (the upper surface of the wiring layer 13) in FIG. 2. In the same manner, each through hole VH4 is, for example, tapered so that the opening width (diameter) is decreased from the upper side (the upper surface of the insulation layer 24) toward the lower side (the electrode terminals 42). Each of the through holes VH3 and VH4 has a shape of, for example, an inverted truncated cone so that the lower open end has a smaller diameter than the upper open end. The thickness of the insulation layer 24 from the upper surface of the insulation layer 23 to the upper surface of the insulation layer 24 may be, for example, approximately 15 µm to 45 µm.

As illustrated in FIGS. 1A and 2, the wiring layer 14 is formed on the upper surface of the insulation layer 24. The wiring layer 14 is, for example, the outermost wiring layer (in FIGS. 1A and 2, uppermost wiring layer) of the wiring substrate 10. The wiring layer 14 includes, for example, wiring patterns that are electrically connected to the wiring layer 13 by via wirings filling the through holes VH3. The wiring layer 14 includes, for example, wiring patterns that are electrically connected to the electrode terminals 42 by via wirings filling the through holes VH4. The wiring layer 14 (wiring patterns) is, for example, formed integrally with the via wirings filling the through holes VH3 or the through holes VH4. The wiring layer 14 (wiring patterns) may be laid out on the upper surface of the insulation layer 24 in a planar direction. The wiring patterns of the wiring layer 14 connected to the wiring layer 13 may be electrically connected to the wiring pattern of the wiring layer 14 connected to the electrode terminals 42. The thickness of the wiring layer 14 (wiring patterns) may be, for example, approximately 10 µm to 30 µm.

As illustrated in FIG. 1A, the solder resist layer 61 is formed on the lower surface of the insulation layer 21, which is the outermost insulation layer (in FIG. 1A, lowermost insulation layer). The material of the solder resist layer 61 may be, for example, an insulative resin such as epoxy resin or acrylic resin. The thickness of the solder resist layer 61 may be, for example, approximately 10 µm to 30 µm.

The solder resist layer 61 includes an opening 61X that exposes at least part of the wiring layer 11, or the lowermost wiring layer, as pads P1. In the present example, the opening 61X is formed corresponding to a mount region of a semiconductor chip 71 (refer to FIG. 4) mounted on the wiring substrate 10. For example, the opening 61X exposes the lower surface of the wiring layer 11 and the lower surface of the insulation layer 21 in the mount region. The solder resist layer 61 further includes openings 61Y that expose part of the wiring layer 11 as connection pads P2. In the present example, the openings 61Y are located in a region outside the opening 61X.

The pads P1 are, for example, used as electronic component mount pads electrically connected an electronic component such as a semiconductor chip. That is, the wiring substrate 10 has the surface including the pads P1 as a chip mount surface. The connection pads P2 are, for example, used as pads electrically connected to another wiring substrate or another semiconductor device.

A surface-processed layer may be formed on surfaces of the pads P1 and surfaces of the connection pads P2. Examples of the surface-processed layer include a gold (Au) layer, a Ni layer/Au layer (metal layer in which the Ni layer is used as the bottom layer, and the Au layer and the Ni layer are sequentially stacked), and a Ni layer/palladium (Pd) layer/Au layer (metal layer in which the Ni layer is used as the bottom layer, and the Ni layer, the Pd layer, and the Au layer are sequentially stacked). Each of the Ni layer, the Au layer, and the Pd layer may be, for example, an electroless plated metal layer formed through an electroless plating process or an electrolytic plated metal layer formed through an electrolytic plating process. The Au layer is a metal layer formed with Au or a Au alloy, the Ni layer is a metal layer formed with Ni or a Ni alloy, and the Pd layer is a metal layer formed with Pd or a Pd alloy. An anti-oxidation process such as an organic solderability preservative (OSP) process may be performed to form a surface-processed layer on the surfaces of the pads P1 and the surfaces of the connection pads P2. For example, when the OSP process is performed, the surface-processed layer is formed of, for example, a coating of an organic compound such as an azole compound or an imidazole compound on the surfaces of the pads P1 and the surfaces of the connection pads P2.

The solder resist layer 62 is formed on the upper surface of the insulation layer 24, which is the outermost insulation layer (uppermost insulation layer). The material of the solder resist layer 62 may be, for example, an insulative resin such as epoxy resin or acrylic resin. The thickness of the solder resist layer 62 may be, for example, approximately 10 μm to 30 μm.

The solder resist layer 62 includes openings 62X that expose part of the wiring layer 14 as external connection pads P3. The external connection pads P3 are connectable to external connection terminals such as solder balls or lead pins used when mounting the wiring substrate 10 on a mount substrate such as a motherboard. That is, the wiring substrate 10 has the surface including the external connection pads P3 as an external connection terminal surface. A surface-processed layer may be formed on the surfaces of the external connection pads P3. Examples of the surface-processed layer include a Au layer, a Ni layer/Au layer, and a Ni layer/Pd layer/Au layer. For example, an anti-oxidation process such as an OSP process may be performed to form a surface-processed layer of, for example, a coating of an organic compound such as an azole compound or an imidazole compound on the surfaces of the external connection pads P3. The wiring layer 14 exposed in the openings 62X (or surface-processed layer formed on the wiring layer 14) may be used as the external connection terminals.

Structure of Semiconductor Device 70

Figure 4:
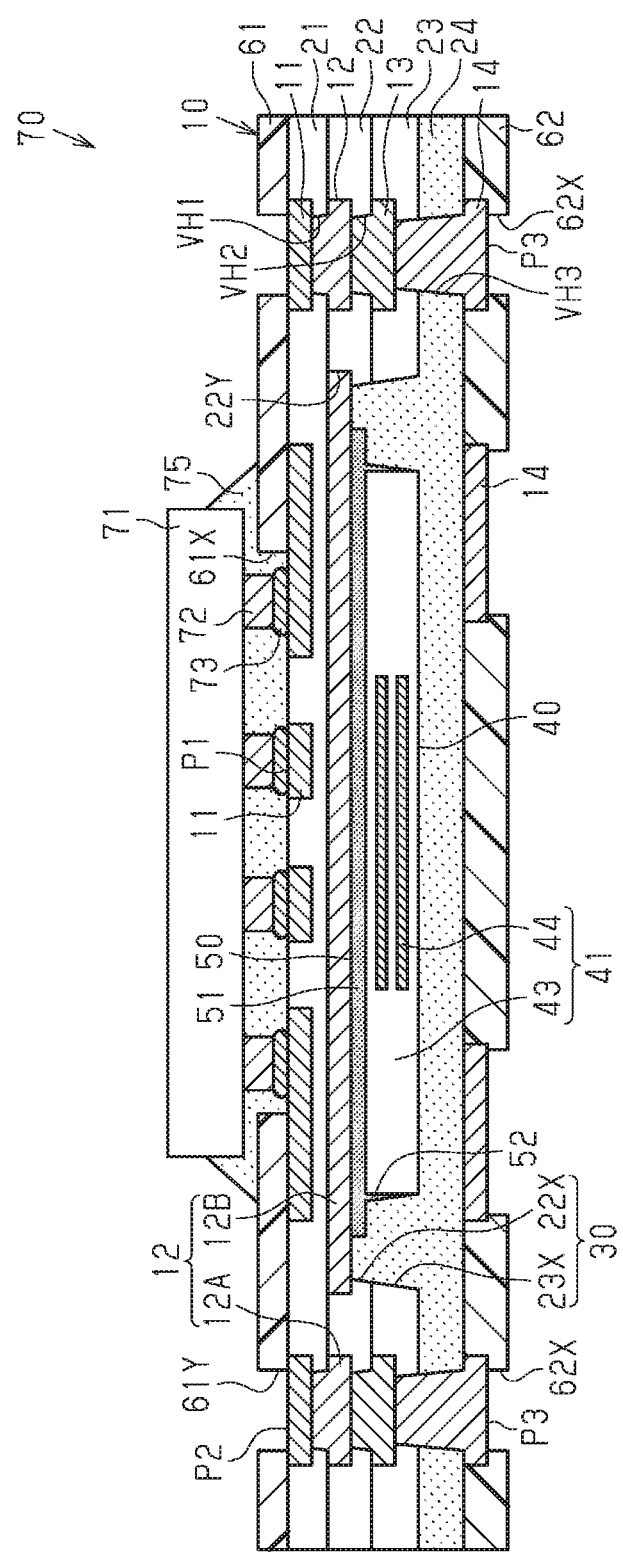
FIG. 4 is a schematic cross-sectional view illustrating a semiconductor device including the wiring substrate illustrated in FIG. 1A.

The structure of a semiconductor device 70 will now be described with reference to FIG. 4. FIG. 4 illustrates the wiring substrate 10 that is inverted from FIG. 1A.

The semiconductor device 70 includes the wiring substrate 10, one or more semiconductor chips 71, and an underfill resin 75. The semiconductor chip 71 is flip-chip mounted on the wiring substrate 10. For example, connection terminals 72 are disposed on a circuit formation surface (in FIG. 4, lower surface) of the semiconductor chip 71. The connection terminals 72 are joined to the pads P1 of the wiring substrate 10 via joining members 73 so that the semiconductor chip 71 is electrically connected to the pads P1 (wiring layer 11) via the connection terminals 72 and the joining members 73.

The semiconductor chip 71 may be, for example, a logic chip such as a central processing unit (CPU) chip or a graphics processing unit (GPU) chip. The semiconductor chip 71 may be, for example, a memory chip such as a dynamic random access memory (DRAM) chip, a static random access memory (SRAM) chip, or a flash memory chip. Multiple semiconductor chips 71 including a combination of a logic chip and a memory chip may be mounted on the wiring substrate 10.

The connection terminals 72 may be, for example, metal posts. The connection terminals 72 are rod-shaped connection terminals extending downward from the circuit formation surface of the semiconductor chip 71. The material of the connection terminals 72 may be, for example, copper or a copper alloy. The connection terminals 72 may be, for example, metal bumps such as gold bumps instead of metal posts.

The joining members 73 are joined to the pads P1 and also joined to the connection terminals 72. The joining members 73 may be, for example, a tin (Sn) layer or a solder layer. The material of the solder layer may be, for example, lead (Pb)-free solder of Sn-silver (Ag)-based, Sn—Cu-based, or Sn—Ag—Cu-based.

The underfill resin 75 fills the space between the wiring substrate 10 and the semiconductor chip 71. The material of the underfill resin 75 may be, for example, an insulative resin such as epoxy resin.

In the present embodiment, the insulation layer 21 is an example of a first insulation layer. The combination of the insulation layers 22 and 23 is an example of a second insulation layer. The insulation layer 24 is an example of a filling insulation layer. The opening 30 is an example of an opening. The adhesive layer 50 is an example of an adhesive layer. The chip capacitor 40 is an example of an electronic component. The wiring layer 14 is an example of a wiring layer. The capacitor body 41 is an example of a main body. The electrode terminal 42 is an example of an electrode terminal. The metal layer 12B is an example of a metal layer.

Manufacturing Method of Wiring Substrate 10

A method for manufacturing the wiring substrate 10 will now be described.

Figure 5A:
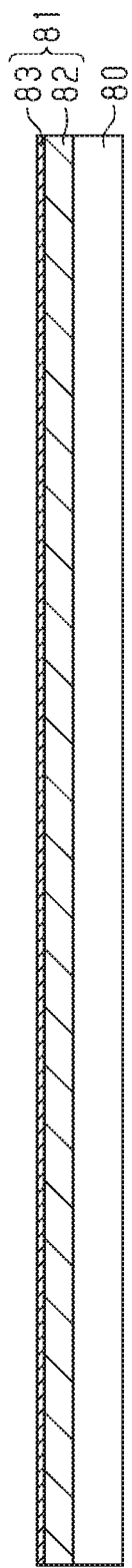

As illustrated in FIG. 5A, a structural body including a support body 80 and a carrier-added metal foil 81 applied to the upper surface of the support body 80 is prepared. The support body 80 is, for example, a prepreg obtained by impregnating a reinforce material such as a woven or non-woven cloth of glass fiber, aramid fiber, or LCP fiber, with a thermosetting resin such as epoxy resin or polyimide resin. The carrier-added metal foil 81 includes a carrier layer 82 and an ultrathin metal foil 83 stacked on the upper surface of the carrier layer 82 with a release layer (not illustrated) located in between. The carrier layer 82 is provided as a support material that eases handling of the metal foil 83. The carrier layer 82 is, for example, a copper foil having a thickness of approximately 15 μm to 70 μm. The metal foil 83 is, for example, a copper foil having a thickness of approximately 0.5 μm to 5 μm.

The material of the carrier layer 82 is not limited to copper and may be a conductive metal other than copper or an insulative material such as resin. The material of the metal foil 83 is not limited to copper and may be a metal other than copper.

Figure 5B:
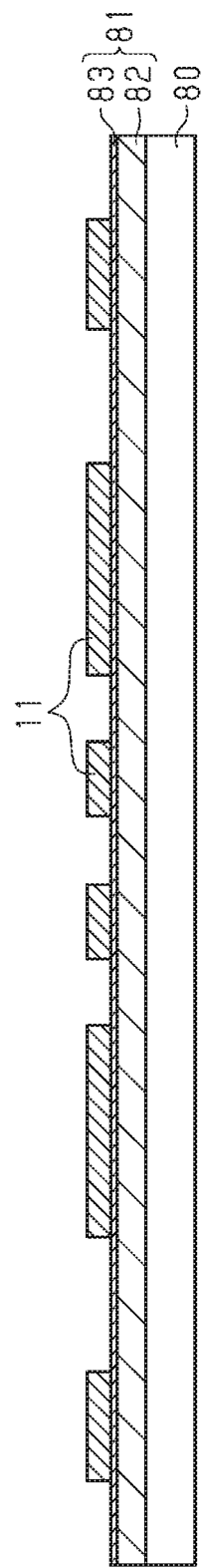

In the step illustrated in FIG. 5B, the wiring layer 11 is formed on the upper surface of the metal foil 83. The wiring layer 11 may be, for example, formed through a semi-additive process. For example, a resist pattern (not illustrated) is formed on the upper surface of the metal foil 83. The resist pattern includes an opening corresponding to the shape of the wiring layer 11. Electrolytic copper plating that uses the metal foil 83 as the power feeding layer is performed to deposit copper plating on the upper surface of the metal foil 83 exposed in the opening of the resist pattern. Subsequent removal of the resist pattern forms the wiring layer 11 on the metal foil 83. In addition to the semi-additive process, various wiring forming processes such as a subtractive process may be used as the process for forming the wiring layer 11.

Figure 5C:
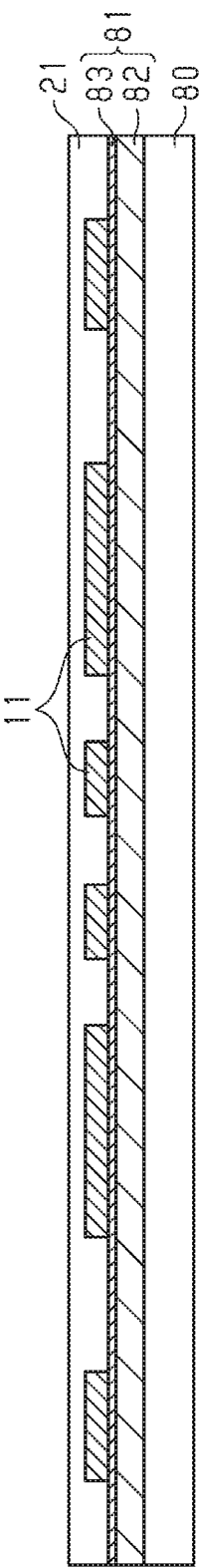

In the step illustrated in FIG. 5C, the insulation layer 21 is formed on the upper surface of the metal foil 83 to entirely cover the wiring layer 11. For example, when a resin film is used as the insulation layer 21, the upper surface of the metal foil 83 is laminated with the resin film. The resin film is heated at a curing temperature or higher (e.g., approximately 130° C. to 200° C.) while being pressed so that the resin film is cured to form the insulation layer 21. The resin film may be, for example, a film of thermosetting resin including epoxy resin as a main component. When a liquid or paste of insulative resin is used as the insulation layer 21, the liquid or paste of insulative resin is applied to the upper surface of the metal foil 83 through a spin coating process or the like. The applied insulative resin is heated at a curing temperature or higher so that the insulative resin is cured to form the insulation layer 21. The liquid or paste of insulative resin may be, for example, a thermosetting resin including epoxy resin as a main component.

Figure 6A:
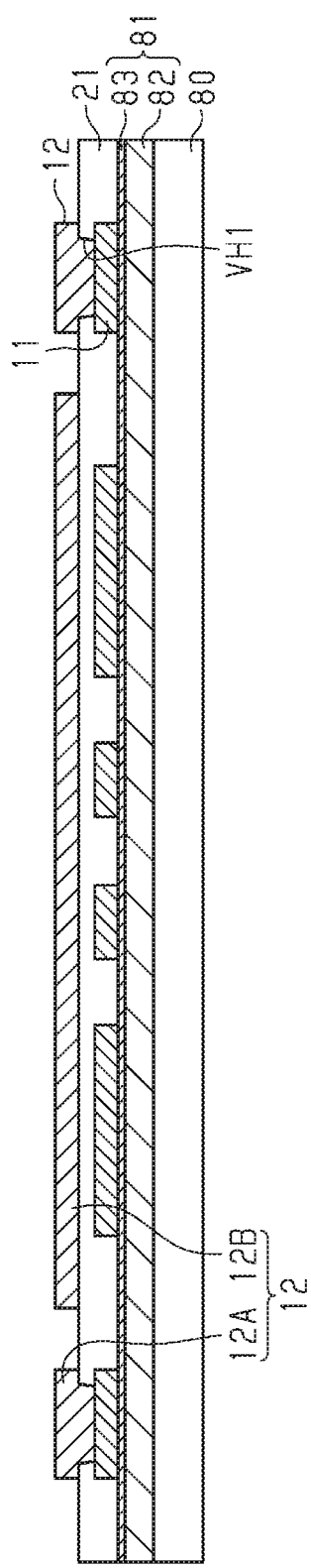

In the step illustrated in FIG. 6A, the through holes VH1 are formed to extend through the insulation layer 21 in the thickness-wise direction and expose part of the upper surface of the wiring layer 11. The through holes VH1 may be formed, for example, by laser cutting using a $CO_2$ laser or a YAG laser. When the insulation layer 21 is formed of a photosensitive resin, the desired through holes VH1 may be formed through photolithography.

When the through holes VH1 are formed by laser cutting, a desmear process is performed to remove resin smears of the insulation layer 21 from the upper surface of the wiring layer 11 exposed in the bottom of the through holes VH1. The desmear process may be performed, for example, using a permanganate process.

Next, for example, a semi-additive process is performed to form the via wirings filling the through holes VH1 and form the conductive layer 12 on the upper surface of the insulation layer 21. The conductive layer 12 includes the wiring layer 12A and the metal layer 12B. The wiring layer 12A is electrically connected to the wiring layer 11 by the via wirings filling the through holes VH1. The metal layer 12B is formed in the mount region of the chip capacitor 40 (refer to FIG. 1A).

Figure 6B:
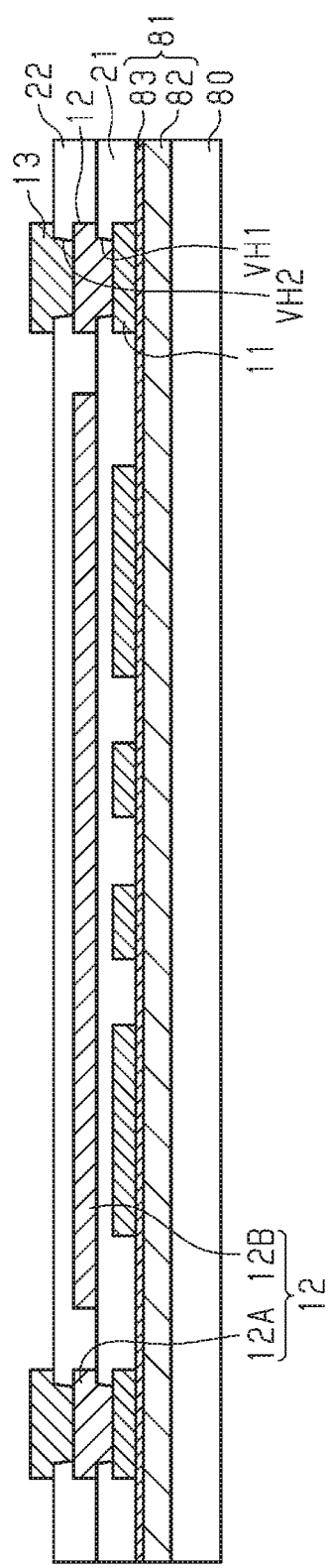

In the step illustrated in FIG. 6B, the insulation layer 22 is formed on the upper surface of the insulation layer 21. The insulation layer 22 includes the through holes VH2 exposing part of the upper surface of the wiring layer 12A. The insulation layer 22 covers the entire upper surface and the entire side surface of the metal layer 12B. Next, for example, a semi-additive process is performed to form the via wirings filling the through holes VH2 and form the wiring layer 13 on the upper surface of the insulation layer 22.

In the step illustrated in FIG. 7A, in the same manner as illustrated in FIG. 5C, the insulation layer 23 is formed on the upper surface of the insulation layer 22 to cover the wiring layer 13. The insulation layer 23 covers the entire upper surface and the entire side surface of the wiring layer 13.

In the step illustrated in FIG. 7B, the through hole 23X and the through hole 22X are formed. The through hole 23X extends through the insulation layer 23 in the thickness-wise direction to expose the part of the metal layer 12B corresponding to the mount region of that the chip capacitor 40 (refer to FIG. 1A). The through hole 22X is in communication with the through hole 23X and extends through the insulation layer 22 in the thickness-wise direction. That is, the through holes 22X and 23X extend through the insulation layers 22 and 23 in the thickness-wise direction to expose part of the upper surface of the metal layer 12B. The through hole 22X is slightly smaller in planar size than the metal layer 12B. Thus, the peripheral edge of the metal layer 12B is covered by the insulation layer 22. The through holes 22X and 23X may be formed, for example, by laser cutting using a $CO_2$ laser or a YAG laser. The metal layer 12B is used as a stopper layer of laser cutting. This appropriately limits damage to, for example, the insulation layer 21, which is located under the insulation layer 22, caused by excessive laser cutting.

The step illustrated in FIG. 7B connects the through hole 22X and the through hole 23X to form the opening 30, which extends through the insulation layer 22 and the insulation layer 23 in the thickness-wise direction. The opening 30 exposes part of the upper surface of the metal layer 12B.

Figure 8A:
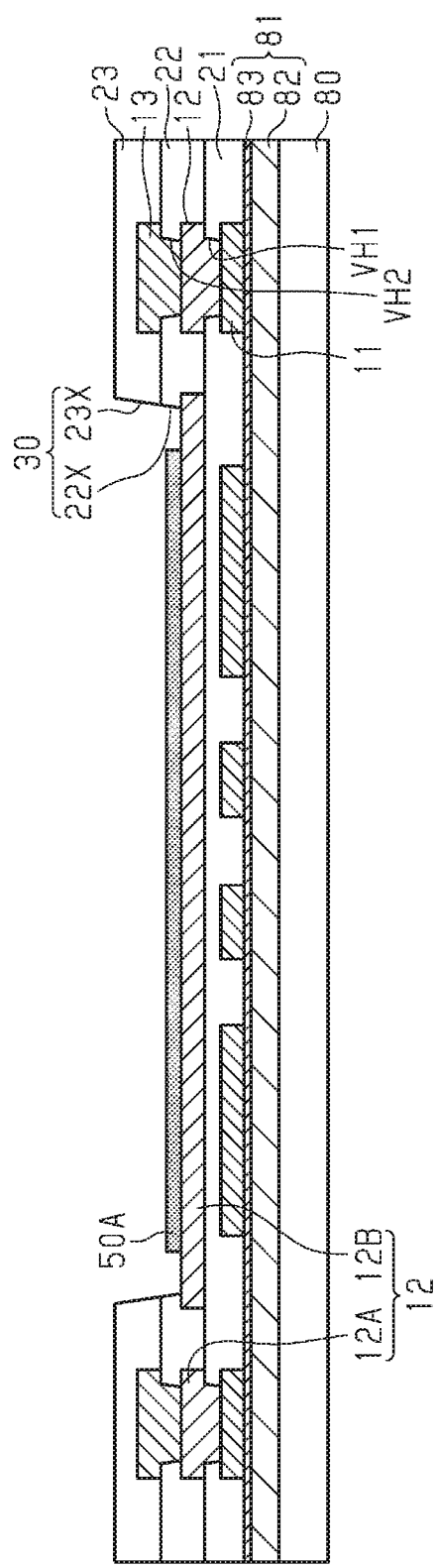

In the step illustrated in FIG. 8A, the adhesive layer 50A is formed on the upper surface of the metal layer 12B exposed in the opening 30. The adhesive layer 50A may be formed, for example, by applying a liquid resin or a resin paste to the upper surface of the metal layer 12B. The adhesive layer 50A may be, for example, an adhesive obtained by mixing a filler into a base resin such as epoxy resin. In the step illustrated in FIG. 8A, the adhesive layer 50A is used in an uncured state.

Figure 8B:
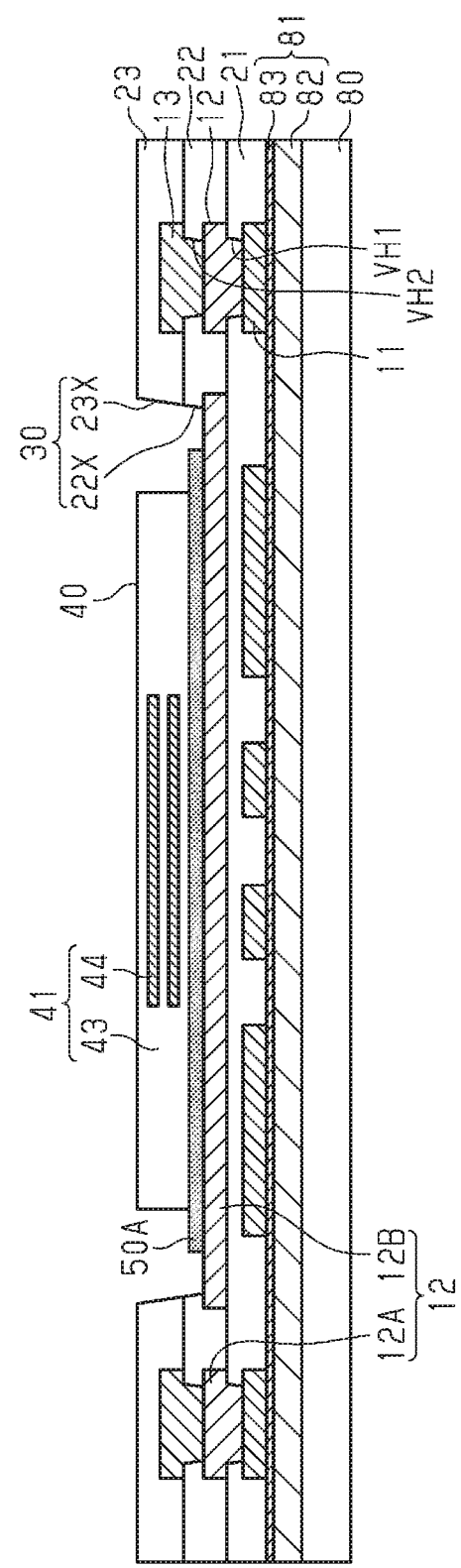

In the step illustrated in FIG. 8B, the chip capacitor 40 is temporarily fixed to (mounted on) the adhesive layer 50A in the opening 30 using a mounter. At this time, the adhesive layer 50A is not thermally cured and is in the uncured state. That is, in the step illustrated in FIG. 8B, the adhesive layer 50A is maintained in the uncured state. For example, after this step, the adhesive layer 50A is semi-cured.

In the step illustrated in FIG. 9A, a resin layer 24A is formed to cover the entire upper surface of the insulation layer 23 and fill the opening 30. When a resin film is used as the resin layer 24A, the upper surface of the insulation layer 23 is laminated with the resin film, and then pressure is applied to the resin film from above. As a result, the space between the wall surface of the opening 30 and the chip capacitor 40 is filled with the resin layer 24A. The resin layer 24A filling the opening 30 is formed. The resin film may be, for example, a film of thermosetting resin including epoxy resin as a main component. After the step illustrated in FIG.

9A, the resin layer 24A and the adhesive layer 50A are not terminally cured and are in the uncured state. That is, in this step, the resin layer 24A and the adhesive layer 50A maintain the uncured state. The resin layer 24A and the adhesive layer 50A are, for example, semi-cured. The uncured resin layer 24A covers the side surface and the upper surface of the chip capacitor 40. However, the adhesion of the interface between the uncured resin layer 24A and the side and upper surfaces of the chip capacitor 40 is low. In particular, the interface between the uncured resin layer 24A and the capacitor body 41 (dielectric layers 43) has low adhesion. The uncured adhesive layer 50A is formed on only the upper surface of the metal layer 12B. That is, in the step illustrated in FIG. 9A, the cover portion 52 illustrated in FIG. 1B is not yet formed in the adhesive layer 50A, and only the base portion 51 is formed on the upper surface of the metal layer 12B.

In the step illustrated in FIG. 9B, the resin layer 24A and the adhesive layer 50A that are both in the uncured state are heated so that the resin layer 24A and the adhesive layer 50A are cured. In this step, for example, the resin layer 24A and the adhesive layer 50A are heated to a curing temperature or higher (for example, approximately 130° C. to 200° C.) at a constant temperature increasing rate. The resin layer 24A and the adhesive layer 50A are heated and cured at the temperature. This heating process melts the uncured adhesive layer 50A and lowers the viscosity of the adhesive layer 50A. The adhesive layer 50A, which has the higher adhesion to the chip capacitor 40, pushes the resin layer 24A aside and flows into the interface between the chip capacitor 40 and the resin layer 24A. In the present example, the interface between the uncured resin layer 24A and the capacitor body 41 particularly has low adhesion. Hence, the adhesive layer 50A, which has a higher adhesion to the capacitor body 41 than the resin layer 24A, pushes the resin layer 24A aside and flows along the side surface of the capacitor body 41 into the interface between the side surface of the capacitor body 41 and the resin layer 24A. As a result, part of the adhesive layer 50A extends upward along the side surface of the capacitor body 41 to form the cover portion 52 extending upward from the upper surface of the base portion 51 and covering the side surface of the capacitor body 41. At this time, in the adhesive layer 50A, mainly the base resin, the viscosity of which has been lowered by the heating process, flows to the side surface of the capacitor body 41 and extends upward. In other words, the filler in the adhesive layer 50A resists to flow to the side surface of the capacitor body 41. As a result, the content ratio of filler in the cover portion 52 is lower than the content ratio of filler in the base portion 51. In addition, the content ratio of filler in the cover portion 52 is lower at positions more distant from the base portion 51.

In addition, the minimum melt viscosity of the adhesive layer 50A is set to be lower than the minimum melt viscosity of the resin layer 24A. Thus, the adhesive layer 50A has a higher fluidity than the resin layer 24A. This allows the adhesive layer 50A to flow to the side surface of the capacitor body 41, which has a lower adhesion to the resin layer 24A, in a favorable manner. As a result, the side surface of the capacitor body 41 is covered by the cover portion 52 in a favorable manner.

In addition, the temperature at which the adhesive layer 50A reaches the minimum melt viscosity is set to be lower than that of the resin layer 24A. Therefore, in the step illustrated in FIG. 9B, when the adhesive layer 50A and the resin layer 24A are heated at a constant temperature increasing rate, the adhesive layer 50A reaches the minimum melt viscosity earlier than the resin layer 24A, and the fluidity of the adhesive layer 50A is increased earlier than the resin layer 24A. Accordingly, before thermal curing causes tight contacting force to develop between the resin layer 24A and the capacitor body 41, the adhesive layer 50A having the increased fluidity flows to the side surface of the capacitor body 41 in a favorable manner. As a result, the side surface of the capacitor body 41 is covered by the cover portion 52 in a favorable manner.

Subsequently, when the heating process proceeds, the side surface of the capacitor body 41 is covered by the cover portion 52. When the cover portion 52 is covered by the resin layer 24A, the resin layer 24A and the adhesive layer 50A are cured. This forms the adhesive layer 50 covering the lower surface and the side surface of the chip capacitor 40 in a tight contact state, and the insulation layer 24 filling the opening 30 to cover the surface of the chip capacitor 40 exposed from the adhesive layer 50. At this time, tight contacting force develops between the chip capacitor 40 and the adhesive layer 50. In the present example, tight contacting force develops between the base portion 51 and the lower surface of the chip capacitor 40 and between the cover portion 52 and the side surface of the capacitor body 41. Also, tight contacting force develops between the adhesive layer 50 and the side surface of the insulation layer 24. In addition, tight contacting force develops between the chip capacitor 40 and the insulation layer 24. In the present example, tight contacting force develops between the insulation layer 24 and the upper and side surfaces of the electrode terminals 42 (refer to FIG. 2). The chip capacitor 40 is fixed to a given position in the opening 30 by the tight contacting force between the chip capacitor 40 and the adhesive layer 50, the tight contacting force between the adhesive layer 50 and the insulation layer 24, and the tight contacting force between the chip capacitor 40 and the insulation layer 24.

The insulation layer 24 covers the wall surface of the opening 30 and the upper surface of the insulation layer 23 in a tight contact state. Since the upper surface of the insulation layer 23 is coplanar with the upper surfaces of the electrode terminals 42 of the chip capacitor 40 or located at a higher position than the upper surfaces of the electrode terminals 42, the upper surface of the insulation layer 24 is formed to be flat in the step illustrated in FIG. 9B.

In the steps illustrated in FIGS. 10A and 10B, the through holes VH3 are formed to extend through the insulation layers 23 and 24 in the thickness-wise direction in desired locations of the insulation layers 23 and 24. In addition, as illustrated in FIG. 10B, the through holes VH4 are formed to extend through the insulation layer 24 in the thickness-wise direction in desired locations of the insulation layer 24. The through holes VH3 and VH4 may be formed, for example, by laser cutting using a $CO_2$ laser or a YAG laser. Next, for example, a semi-additive process is performed to form via wirings filling the through holes VH3 and VH4 and also form the wiring layer 14 on the upper surface of the insulation layer 24 so that the wiring layer 14 is electrically connected to the wiring layer 13 or the electrode terminals 42 by the via wirings.

In the step illustrated in FIG. 11A, the support body 80 and the carrier-added metal foil 81 (carrier layer 82 and metal foil 83) are removed. For example, firstly, the carrier layer 82 and the support body 80 are mechanically separated from the metal foil 83. Since the release layer (not illustrated) is located between the carrier layer 82 and the metal foil 83, adhesion force between the carrier layer 82 and the metal foil 83 is low. This facilitates separation of the carrier layer 82 and the support body 80 from the metal foil 83. Then, the metal foil 83 is removed by etching. At this time, when the outermost layer of the wiring layer 14 is a Cu layer, the wiring layer 14 is masked and etching is performed to prevent the wiring layer 14 from being etched together with the metal foil 83. When the metal foil 83 is removed, as illustrated in FIG. 11A, the lower surface of the wiring layer 11 and the lower surface of the insulation layer 21 are exposed to the exterior.

In the step illustrated in FIG. 11B, the solder resist layer 61 including the openings 61X and 61Y is formed on the lower surface of the insulation layer 21, and the solder resist layer 62 including the openings 62X is formed on the upper surface of the insulation layer 24. The solder resist layers 61 and 62 may be formed, for example, by laminating a photosensitive solder resist film or applying a liquid solder resist and patterning the resist into a desired shape. As a result, the wiring layer 11 is exposed as the pads P1 in the opening 61X and as the connection pads P2 in the openings 61Y. Also, the wiring layer 14 is exposed as the external connection pads P3 in the openings 62X. For example, a metal layer in which a Ni layer is the bottom layer and the Ni layer and a Au layer are sequentially stacked may be formed on the pads P1, P2, and P3. The metal layer may be formed, for example, through an electroless plating process.

The manufacturing steps described above manufacture the wiring substrate 10 illustrated in FIG. 1A. The wiring substrate 10 may be inverted when used or may be arranged at any angle.

The present embodiment has the following advantages.

(1) The wiring substrate 10 includes the opening 30 extending through the insulation layers 22 and 23 in the thickness-wise direction, the chip capacitor 40 fixed by the adhesive layer 50 to the bottom surface in the opening 30, and the insulation layer 24 filling the opening 30 and covering the chip capacitor 40. The adhesive layer 50 includes the base portion 51 covering the lower surface of the chip capacitor 40 in a tight contact state and the cover portion 52 covering the side surface of the chip capacitor 40 in a tight contact state.

In this configuration, the adhesive layer 50 adheres to the side surface and the lower surface of the chip capacitor 40. This increases the area of adhesion between the chip capacitor 40 and the adhesive layer 50 as compared to a configuration in which the adhesive layer 50 adheres to only the lower surface of the chip capacitor 40. Thus, the adhesion strength between the chip capacitor 40 and the adhesive layer 50 is improved. As a result, the fixing strength of the chip capacitor 40 in the opening 30 is improved. Accordingly, rotation or planar movement of the chip capacitor 40 in the opening 30 is appropriately restricted. This appropriately limits lowering of the reliability of an electrical connection between the electrode terminals 42 of the chip capacitor 40 and the via wirings filling the through holes VH4.

(2) The insulation layer 24 covers the side surface of the cover portion 52 in a tight contact state. This allows tight contacting force to develop between the cover portion 52 and the insulation layer 24 and improves the adhesion strength between the insulation layer 24 and the adhesive layer 50. As a result, the fixing strength of the chip capacitor 40 in the opening 30 is improved as compared to when an air layer is formed in the space between the side surface of the cover portion 52 and the wall surface of the opening 30.

(3) When an air layer is formed in the space between the side surface of the cover portion 52 and the wall surface of the opening 30, that is, when the insulation layer 24 is not formed between the side surface of the cover portion 52 and the inner surface of the opening 30, the degree of freedom for thermal expansion and contraction of the chip capacitor 40 is increased, so that the tight contacting force between the cover portion 52 and the chip capacitor 40 readily decreases. As a result, separation readily occurs in the interface between the cover portion 52 and the chip capacitor 40.

In this regard, in the wiring substrate 10 of the present embodiment, since the opening 30 is filled with the insulation layer 24, the space between the side surface of the cover portion 52 and the wall surface of the opening 30 is filled with the insulation layer 24. Since an air layer is barely present between the side surface of the cover portion 52 and the wall surface of the opening 30, the degree of freedom for the thermal expansion and contraction of the chip capacitor 40 is decreased. This limits lessening of the tight contacting force between the cover portion 52 and the side surface of the chip capacitor 40, thereby reducing occurrence of separation in the interface between the cover portion 52 and the chip capacitor 40.

(4) The cover portion 52 is formed so that the ratio L1/T1 is greater than or equal to five (preferably, greater than or equal to ten) where L1 denotes the length at which the cover portion 52 extends from the upper surface of the base portion 51 along the side surface of the chip capacitor 40 and T1 denotes the maximum thickness of the cover portion 52. Thus, while increasing the height of the cover portion 52 extending upward along the side surface of the chip capacitor 40, the thickness of the cover portion 52 is decreased. Increases in the height of the cover portion 52 extending upward along the side surface of the chip capacitor 40 increase the area of contact between the chip capacitor 40 and the cover portion 52. This increases the adhesion strength between the chip capacitor 40 and the adhesive layer 50, thereby firmly fixing the chip capacitor 40.

The adhesive layer 50 has a lower rigidity than the insulation layer 24. If the ratio of the adhesive layer 50 to the insulation layer 24 is increased, the overall rigidity of the wiring substrate 10 may be lowered. In this regard, in the present embodiment, the thickness T1 of the cover portion 52 is small relative to the extension length L1 of the cover portion 52. With this configuration, even when the extension length L1 of the cover portion 52 is increased, an increase in the ratio of the adhesive layer 50 to the insulation layer 24 is limited, thereby limiting lowering of the overall rigidity of the wiring substrate 10. Thus, the relative increase in the extension length L1 of the cover portion 52 improves the fixing strength of the chip capacitor 40, and the relative decrease in the thickness of the cover portion 52 limits lowering of the overall rigidity of the wiring substrate 10.

(5) The cover portion 52 covers the side surface of the capacitor body 41 of the chip capacitor 40 exposed from the electrode terminals 42. With this configuration, the cover portion 52 of the adhesive layer 50 is in tight contact with the side surface of the capacitor body 41, which has low adhesion to the insulation layer 24. Thus, the fixing strength of the chip capacitor 40 is appropriately improved.

(6) The cover portion 52 covers the entire side surface of the capacitor body 41. This increases the area of adhesion between the side surface of the capacitor body 41 and the adhesive layer 50, thereby improving the adhesion strength between the chip capacitor 40 and the adhesive layer 50. As a result, the fixing strength of the chip capacitor 40 is improved.

(7) The width of the cover portion 52 is decreased from the upper surface of the base portion 51 toward the upper surface of the chip capacitor 40. Thus, the part of the cover portion 52 covering the side surface of the lower portion of the chip capacitor 40 is wide. The thick part of the cover portion 52 covers a portion of the chip capacitor 40 that is prone to moving. Thus, rotation and planar movement of the chip capacitor 40 in the opening 30 is appropriately restricted.

(8) In a known method for manufacturing a wiring substrate, an adhesive layer is completely cured so that the adhesive layer is adhered to the chip capacitor in a step corresponding to the step illustrated in FIG. 8B, that is, the step of mounting a chip capacitor on the bottom surface of a cavity via the adhesive layer. Subsequently, a filling insulation layer is formed to fill the cavity and cover the chip capacitor. As described above, in the known manufacturing method, after the adhesive layer is completely cured, the cavity is filled with the filling insulation layer, and the filling insulation layer is cured. In this case, when curing the filling insulation layer, the adhesive layer has been completely cured, and the adhesive layer will not flow to the side surface of the chip capacitor. The wiring substrate manufactured through the known manufacturing method does not include an adhesive layer that covers the side surface of the chip capacitor. In this case, the side surface of the chip capacitor is covered by the filling insulation layer. The adhesion of the filling insulation layer to the side surface of the chip capacitor except electrode terminals is low. The filling insulation layer that covers the side surface of the chip capacitor except the electrode terminals subtly contributes to fixing of the chip capacitor. As a result, in the known wiring substrate, the chip capacitor is likely to have a low fixing strength and prone to moving in the opening.

In this regard, in the manufacturing method of the present embodiment, after the chip capacitor 40 is temporarily fixed to the bottom surface in the opening 30 via the adhesive layer 50A, the opening 30 is filled with the resin layer 24A while the adhesive layer 50A is maintained in the uncured state. Subsequently, the adhesive layer 50A and the resin layer 24A that are both in the uncured state are heated so that the adhesive layer 50A and the resin layer 24A are cured together. In this heating process, the uncured adhesive layer 50A melts and the viscosity of the adhesive layer 50A is decreased. This allows the adhesive layer 50A, which has high adhesion to the chip capacitor 40, to flow to the interface between the chip capacitor 40 and the resin layer 24A. The adhesive layer 50A pushes the resin layer 24A aside and flows between the side surface of the chip capacitor 40 and the resin layer 24A, which have low adhesion. Part of the adhesive layer 50A extends upward along the side surface of the chip capacitor 40. As a result, the cover portion 52 extends upward from the upper surface of the base portion 51 and covers the side surface of the capacitor body 41. This increases the area of adhesion between the chip capacitor 40 and the adhesive layer 50, thereby improving the adhesion strength between the chip capacitor 40 and the adhesive layer 50. As a result, the fixing strength of the chip capacitor 40 is improved. This appropriately limits lowering of the reliability of an electrical connection between the electrode terminals 42 of the chip capacitor 40 and the via wirings filling the through holes VH4.

(9) The through holes 22X and 23X extending through the insulation layers 22 and 23 formed on the upper surface of the insulation layer 21 form the cavity accommodating the chip capacitor 40. For example, if the upper surface of the insulation layer 21 is thinned to form a cavity and the chip capacitor 40 is disposed in the cavity, the thickness of the insulation layer 21 between the chip capacitor 40 and the wiring layer 11 is decreased. This lowers the reliability of insulation between the chip capacitor 40 and the wiring layer 11. In this regard, in the present embodiment, the cavity is formed in only the insulation layers 22 and 23 without thinning the insulation layer 21. The sufficient thickness of the insulation layer 21 between the chip capacitor 40 and the wiring layer 11 improves the reliability of insulation between the chip capacitor 40 and the wiring layer 11.

(10) The metal layer 12B is formed on the upper surface of the insulation layer 21, and the insulation layers 22 and 23 are formed to cover the entire surface of the metal layer 12B. Subsequently, laser cutting is performed to form the through holes 22X and 23X, which are slightly smaller than the metal layer 12B, in the insulation layers 22 and 23. As described above, when the through holes 22X and 23X are formed with presence of the metal layer 12B, the upper surface of the insulation layer 21 will not be thinned by laser cutting.

(11) The through holes 22X and 23X in the insulation layers 22 and 23 are tapered so that the opening width is decreased from the upper surface of the insulation layer 23 toward the upper surface of the metal layer 12B. This improves the filling of resin in the space between the chip capacitor 40 and the insulation layers 22 and 23 when forming the insulation layer 24 in the through holes 22X and 23X. Thus, formation of a void in the insulation layer 24 is limited.

It should be apparent to those skilled in the art that the foregoing embodiments may be implemented in many other specific forms without departing from the scope of this disclosure. Particularly, it should be understood that the foregoing embodiments may be implemented in the following forms.

The embodiment and the following modified examples may be combined as long as the combined modified examples remain technically consistent with each other.

The structure of the wiring substrate 10 in the embodiment is not particularly limited. For example, in the wiring substrate 10, the number of wiring layers, routing, and the number of insulation layers may be changed in various manners.

Figure 12:
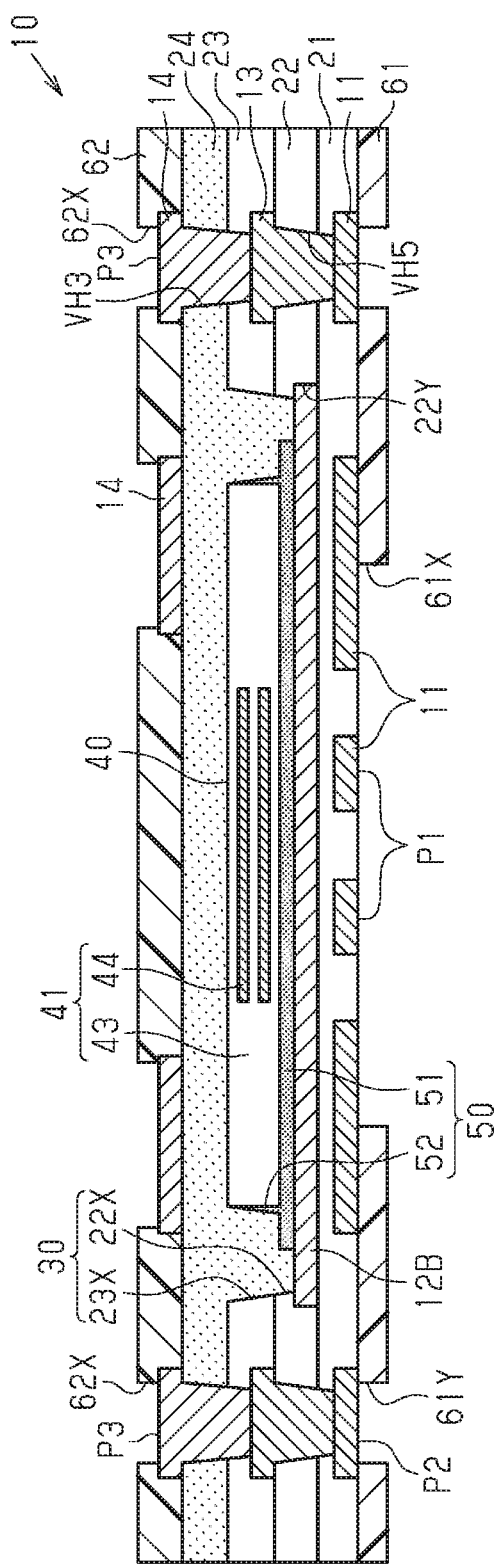
FIG. 12 is a schematic cross-sectional view illustrating a modified example of a wiring substrate.

For example, as illustrated in FIG. 12, the wiring layer 12A illustrated in FIG. 1A may be omitted. In this case, for example, through holes VH5 extend through the insulation layers 21 and 22 in the thickness-wise direction to expose part of the upper surface of the wiring layer 11. The wiring layer 13 formed on the upper surface of the insulation layer 22 is electrically connected to the wiring layer 11 by via wirings filling the through holes VH5. The wiring layer 13 is, for example, formed integrally with the via wirings filling the through holes VH5.

For example, in the wiring substrate 10 illustrated in FIG. 1A, a wiring layer may be formed on the upper surface of the insulation layer 23 and electrically connected to the wiring layer 13. In this case, the wiring layer 14 is electrically connected to the wiring layer formed on the upper surface of the insulation layer 23, for example, by a via wiring extending through the insulation layer 24 in the thickness-wise direction.

For example, the wiring layer 13 illustrated in FIG. 1A may be omitted. In this case, the wiring layer 14 may be electrically connected to the wiring layer 12A by a via wiring extending through the insulation layers 22, 23, and 24 in the thickness-wise direction.

For example, the metal layer 12B illustrated in FIG. 1A may be omitted. In this case, for example, the chip capacitor 40 is fixed to the upper surface of the insulation layer 21 exposed in the bottom of the opening 30 by the adhesive layer 50. That is, the adhesive layer 50 is formed on the upper surface of the insulation layer 21 exposed in the opening 30.

In the wiring substrate 10 of the embodiment, the upper and lower surfaces of the wiring layer 11, the conductive layer 12, and the wiring layers 13 and 14 may include rough surfaces.

In the wiring substrate 10 of the embodiment, the cavity forming insulation layer (second insulation layer) is formed by the two insulation layers 22 and 23. Instead, the cavity forming insulation layer may be formed by one insulation layer or three or more insulation layers.

In the wiring substrate 10 of the embodiment, the number of wiring layers and insulation layers stacked on the upper surface of the insulation layer 24, which fills the cavity, is not particularly limited. For example, the wiring layer 14, an insulation layer covering the wiring layer 14, and a wiring layer formed on the insulation layer may be sequentially stacked on the upper surface of the insulation layer 24.

In the wiring substrate 10 of the embodiment, the number of wiring layers and insulation layers stacked on the lower surface of the cavity forming insulation layer 22 is not particularly limited. For example, after multiple wiring layers and multiple insulation layers are sequentially stacked on the upper surface of the insulation layer 21, the cavity forming insulation layers 22 and 23 may be stacked. In other words, in the embodiment, "the first insulation layer" is embodied by the single insulation layer 21. Instead, "the first insulation layer" may be embodied by multiple insulation layers.

The solder resist layer 61 may be omitted from the embodiment.

The solder resist layer 62 may be omitted from the embodiment.

In the wiring substrate 10 of the embodiment, the surface including the pads P1 is the chip mount surface, and the surface including the external connection pads P3 is the external connection terminal surface. Instead, for example, the surface including the pads P1 may be the external connection terminal surface, and the surface including the external connection pads P3 may be the chip mount surface.

The wiring substrate 10 of the embodiment has a configuration of a coreless substrate. Instead, for example, the wiring substrate 10 may be a build-up wiring substrate including a core substrate.

The number of chip capacitors 40 incorporated in the wiring substrate 10 of the embodiment is not limited. For example, multiple chip capacitors 40 may be incorporated in the wiring substrate 10. In this case, the same number of openings 30 as the incorporated chip capacitors 40 may be formed, or the multiple chip capacitors 40 may be arranged in a single opening 30.

In the embodiment, the chip capacitor 40 including the two electrode terminals 42 is incorporated in the wiring substrate 10. Instead, for example, an electronic component such as a capacitor including three or more electrode terminals 42 may be incorporated in the wiring substrate.

In the embodiment, the chip capacitor 40 is incorporated as an electronic component in the wiring substrate 10. However, there is no limitation to such a configuration. For example, the electronic component may be a chip component such as a chip resistor or a chip inductor or a crystal oscillator instead of the chip capacitor 40. The electronic component incorporated in the wiring substrate 10 is not limited to one kind. Different kinds of electronic component may be incorporated.

The structure of the electronic component incorporated in the wiring substrate 10 of the embodiment is not particularly limited. For example, as long as the electronic component includes a main body and an electrode terminal formed on the main body, the remaining structure of the electronic component is not particularly limited. For example, the electronic component may include an electrode terminal on only the upper surface of the main body. Alternatively, the electronic component may include an electrode terminal on only the upper surface and the lower surface of the main body. That is, the electrode terminal does not have to be formed on the side surface of the main body.

In the embodiment, the number of semiconductor chips 71 mounted on the wiring substrate 10 of the semiconductor device 70 and the mounting mode (e.g., flip-chip mounting, wire-bonding mounting, or combination of these) of the semiconductor chips 71 may be changed in various manners.

In the embodiment, wiring layers and insulation layers are stacked on one surface of the support substrate mainly through a build-up process, and the support substrate is finally removed to manufacture a coreless wiring substrate. Instead, for example, the carrier-added metal foil 81 is formed on both surfaces of a support substrate, and wiring layers and insulation layers may be stacked on the surfaces of the support substrate mainly through a build-up process. The support substrate may be finally removed to manufacture multiple coreless wiring substrates. In this case, for example, in the same manner as in the steps illustrated in FIGS. 5A to 10B, the wiring layers and the insulation layers are sequentially stacked on each surface of the support substrate from the chip mount surface side. Finally, the support substrate is removed.

In the method for manufacturing the wiring substrate 10 of the embodiment, the support substrate includes the support body 80 and the carrier layer 82. Instead, for example, the carrier layer 82 may be omitted, and the support substrate may include only the support body 80.

In the method for manufacturing the wiring substrate 10 of the embodiment, the metal foil 83 may be omitted.

In the embodiment, a method for manufacturing a single unit (one unit) is embodied. Instead, a method for manufacturing a batch of units may be embodied.

CLAUSE

This disclosure further encompasses the following embodiment.

1. A method for manufacturing a wiring substrate, the method including:

forming a metal layer on an upper surface of a first insulation layer;

forming a second insulation layer on the upper surface of the first insulation layer to cover the metal layer;

forming an opening that extends through the second insulation layer in a thickness-wise direction to expose an upper surface of the metal layer;

maintaining an adhesive layer in an uncured state while temporarily fixing an electronic component to a bottom surface in the opening with the adhesive layer;

maintaining the adhesive layer and a resin layer in an uncured state while forming the resin layer that covers an upper surface of the second insulation layer and fills the opening; and heating the adhesive layer and the resin layer that are in the uncured state to cure the adhesive layer and the resin layer, wherein an adhesion of the adhesive layer to the electronic component is higher than that of the resin layer to the electronic component.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

What is claimed is:

1. A wiring substrate, comprising:
   a first insulation layer;
   a second insulation layer formed on an upper surface of the first insulation layer;
   an opening extending through the second insulation layer in a thickness-wise direction;
   an adhesive layer formed on a bottom surface in the opening;
   an electronic component fixed in the opening by the adhesive layer;
   a filling insulation layer that covers an upper surface of the second insulation layer and fills the opening to cover the electronic component; and
   a wiring layer formed on an upper surface of the filling insulation layer, wherein
   the adhesive layer includes a base portion that covers a lower surface of the electronic component in a tight contact state and a cover portion that covers a side surface of the electronic component in a tight contact state,
   a content ratio of filler in the cover portion is lower than a content ratio of filler in the base portion,
   the filling insulation layer covers a side surface of the cover portion in a tight contact state
   the adhesive layer has a lower rigidity than the filling insulation layer,
   when a length at which the cover portion extends upward from an upper surface of the base portion along the side surface of the electronic component is denoted by L1, and a maximum thickness of the cover portion is denoted by T1, a ratio L1/T1 is greater than or equal to five,
   the content ratio of filler in the cover portion is decreased from the base portion toward an upper surface of the electronic component, and
   the cover portion has a minimum melt viscosity that is lower than that of the base portion.

2. The wiring substrate according to claim 1, wherein the cover portion at least partially rises from the base portion at a height of more than half of the side surface of the electronic component.

3. The wiring substrate according to claim 1, wherein the ratio L1/T1 is greater than or equal to ten.

4. The wiring substrate according to claim 1, wherein
   the electronic component includes a main body and an electrode terminal formed on a surface of the main body, and
   the cover portion covers a side surface of the main body exposed from the electrode terminal.

5. The wiring substrate according to claim 4, wherein the cover portion covers an entire side surface of the main body exposed from the electrode terminal.

6. The wiring substrate according to claim 1, wherein the cover portion has a thickness that is decreased from an upper surface of the base portion toward an upper surface of the electronic component.

7. The wiring substrate according to claim 1, wherein the adhesive layer has a minimum melt viscosity that is lower than that of the filling insulation layer.

8. The wiring substrate according to claim 1, wherein a temperature at which the adhesive layer reaches a minimum melt viscosity is lower than that of the filling insulation layer.

9. The wiring substrate according to claim 1, further comprising:
   a metal layer formed on the upper surface of the first insulation layer, wherein
   the opening exposes an upper surface of the metal layer, and
   the base portion is formed on the upper surface of the metal layer.

10. The wiring substrate according to claim 1, wherein the second insulation layer includes multiple stacked insulation layers.

11. A wiring substrate, comprising:
    a first wiring layer;
    a first insulation layer covering an upper surface and side surfaces of the first wiring layer and exposing a lower surface of the first wiring layer;
    a metal layer formed on an upper surface of the first insulation layer;
    a second insulation layer formed on the upper surface of the first insulation layer;
    an opening extending through the second insulation layer in a thickness-wise direction to expose an upper surface of the metal layer;
    an adhesive layer formed on a bottom surface in the opening;
    an electronic component fixed in the opening by the adhesive layer;
    a filling insulation layer that covers an upper surface of the second insulation layer and fills the opening to cover the electronic component; and
    a second wiring layer formed on an upper surface of the filling insulation layer,
    wherein the adhesive layer includes:
      a base portion that is formed on the upper surface of the metal layer and covers a lower surface of the electronic component in a tight contact state; and
      a cover portion that covers a side surface of the electronic component in a tight contact state,
      a content ratio of filler in the cover portion is lower than a content ratio of filler in the base portion, and
      the filling insulation layer that covers a side surface of the cover portion in a tight contact state.

12. The wiring substrate according to claim 11, wherein the content ratio of filler in the cover portion is decreased from the base portion toward an upper surface of the electronic component.

13. The wiring substrate according to claim 11, wherein when a length at which the cover portion extends upward from an upper surface of the base portion along the side surface of the electronic component is denoted by L1, and a maximum thickness of the cover portion is denoted by T1, a ratio L1/T1 is greater than or equal to five.

14. The wiring substrate according to claim 13, wherein the ratio L1/T1 is greater than or equal to ten.

15. The wiring substrate according to claim 11, wherein
the electronic component includes a main body and an electrode terminal formed on a surface of the main body, and
the cover portion covers a side surface of the main body exposed from the electrode terminal.

16. The wiring substrate according to claim 15, wherein the cover portion covers an entire side surface of the main body exposed from the electrode terminal.

17. The wiring substrate according to claim 11, wherein the cover portion has a thickness that is decreased from an upper surface of the base portion toward an upper surface of the electronic component.

18. The wiring substrate according to claim 11, wherein the adhesive layer has a minimum melt viscosity that is lower than that of the filling insulation layer.

19. The wiring substrate according to claim 11, wherein a temperature at which the adhesive layer reaches a minimum melt viscosity is lower than that of the filling insulation layer.

20. The wiring substrate according to claim 11, wherein the second insulation layer includes multiple stacked insulation layers.

* * * * *